US012787575B2

(12) United States Patent
Kim

(10) Patent No.: US 12,787,575 B2
(45) Date of Patent: Nov. 3, 2026

(54) DISPLAY PANEL AND DISPLAY DEVICE INCLUDING REPAIR STRUCTURE FOR ENHANCED APERTURE RATIO AND TRANSMITTANCE

(71) Applicant: LG Display Co., Ltd., Seoul (KR)

(72) Inventor: Choonghyo Kim, Gyeongsangnam-do (KR)

(73) Assignee: LG Display Co., Ltd., Seoul (KR)

( * ) Notice: Subject to any disclaimer, the term of this patent is extended or adjusted under 35 U.S.C. 154(b) by 439 days.

(21) Appl. No.: 18/516,067

(22) Filed: Nov. 21, 2023

(65) Prior Publication Data

US 2024/0188358 A1 Jun. 6, 2024

(30) Foreign Application Priority Data

Dec. 6, 2022 (KR) ........................ 10-2022-0168525

(51) Int. Cl.
*H10K 59/131* (2023.01)
*H10K 59/122* (2023.01)
*H10K 71/20* (2023.01)

(52) U.S. Cl.
CPC ......... *H10K 59/131* (2023.02); *H10K 59/122* (2023.02); *H10K 71/231* (2023.02)

(58) Field of Classification Search
CPC .. H10K 59/131; H10K 59/122; H10K 71/231; H10K 59/1213; H10K 59/1216; H10K 71/861; H10K 59/121; H10K 59/80515; H10K 59/124; H10K 59/8051; H10D 30/6755; H10D 86/60
See application file for complete search history.

(56) References Cited

U.S. PATENT DOCUMENTS

| | | | | |
|---|---|---|---|---|
| 9,450,040 | B2 * | 9/2016 | Kim | H10K 59/1213 |
| 10,636,864 | B2 * | 4/2020 | Kim | H10K 59/131 |
| 11,574,990 | B2 * | 2/2023 | Kim | H10K 59/1213 |
| 2021/0183968 | A1 | 6/2021 | Kim et al. | |
| 2022/0208869 | A1 | 6/2022 | Jeong et al. | |

FOREIGN PATENT DOCUMENTS

| | | | |
|---|---|---|---|
| KR | 10-2016-0045436 | A | 4/2016 |
| KR | 10-2021-0074510 | A | 6/2021 |
| KR | 10-2022-0096033 | A | 7/2022 |

* cited by examiner

*Primary Examiner* — John P. Dulka
(74) *Attorney, Agent, or Firm* — Fenwick & West LLP

(57) ABSTRACT

A display panel and a display device is disclosed that include: a substrate including a light emitting area and a non-light emitting area, a storage capacitor on the substrate in the light emitting area, a first connection pattern over the substrate in the light emitting area, a second connection pattern electrically connected to the storage capacitor and on the first connection pattern, a third connection pattern on the second connection pattern and electrically connected to the second connection pattern, an insulating layer on the third connection pattern and including a first contact hole exposing a portion of an upper surface of the third connection pattern, and an anode electrode on the insulating layer and contacting the third connection pattern through the first contact hole, the first contact hole located in a central portion of the light emitting area.

22 Claims, 13 Drawing Sheets

<Embodiment>

DISPLAY PANEL AND DISPLAY DEVICE INCLUDING REPAIR STRUCTURE FOR ENHANCED APERTURE RATIO AND TRANSMITTANCE

CROSS-REFERENCE TO RELATED APPLICATION

This application claims the priority benefit of Republic of Korea Patent Application No. 10-2022-0168525, filed on Dec. 6, 2022 in the Korean Intellectual Property Office, which is hereby incorporated by reference in its entirety.

BACKGROUND

Technical Field

The present disclosure relates to electronic devices with displays, and more specifically, to a display panel and a display device.

Description of the Related Art

As display technology advances, display devices having various capabilities and functions such as transparent display devices configured to enable an image or information and a lower portion of, or a portion under, a display panel to be viewed together from the front of the display panel have been developed and utilized.

Transmittance and light emitting area are often important considerations so that such display devices can perform display capability effectively and efficiently. It would be therefore desired to improve transmittance and employ a structure capable of increasing the area of a light emitting area for an enhanced light emitting performance.

SUMMARY

To address these issues, one or more embodiments of the present disclosure may provide a display panel and a display device that are capable of preventing the area of a light emitting area from being reduced and the transmittance of a transmissive area from being lowered by a repair area by employing a structure in which a connection pattern including the repair area is included, and the connection pattern is disposed to overlap the light emitting area.

One or more embodiments of the present disclosure may provide a display panel and a display device that are capable of simplifying a manufacturing process, minimizing damage caused by etching, and realizing process optimization by employing a structure including a repair pattern, and an active layer included in an electrode included in a light emitting element in a light emitting area.

One or more embodiments of the present disclosure may provide a display panel and a display device that are capable of being driven with low power by configuring signal lines to extend by a minimum length and thereby enabling minimized signal delay by employing a structure in which a contact hole where a connection pattern and an anode electrode contact each other is located in a concave portion of a storage capacitor.

One or more embodiments of the present disclosure may provide a display panel and a display device that enable an emission layer of a light emitting element in a light emitting area to be uniformly formed by employing a structure in which an area where a connection pattern and an anode electrode contact each other is located in a central portion of the light emitting area.

According to aspects of the present disclosure, an organic light emitting display device can be provided that includes a substrate including at least one light emitting area and a non-light emitting area, a storage capacitor disposed on the substrate in the light emitting area, a first connection pattern disposed over the substrate in the light emitting area, a second connection pattern electrically connected to the storage capacitor and disposed on the first connection pattern, a third connection pattern disposed on the second connection pattern and electrically connected to the second connection pattern, at least one insulating layer disposed on the third connection pattern and including a first contact hole exposing a portion of an upper surface of the third connection pattern, and an anode electrode disposed on the insulating layer and contacting the third connection pattern through the first contact hole, wherein the first contact hole is located in a central portion of the light emitting area.

According to aspects of the present disclosure, an organic light emitting display panel can be provided that includes a substrate including at least one light emitting area and a non-light emitting area, a storage capacitor disposed on the substrate in the light emitting area and including at least one concave portion, a first connection pattern disposed over the substrate in the light emitting area, a second connection pattern electrically connected to the storage capacitor and disposed on the first connection pattern, a third connection pattern disposed on the second connection pattern and electrically connected to the second connection pattern, at least one insulating layer disposed on the third connection pattern and including a first contact hole exposing a portion of an upper surface of the third connection pattern, and an anode electrode disposed on the insulating layer and contacting the third connection pattern through the first contact hole, wherein the third contact connection pattern overlaps the at least one concave portion of the storage capacitor.

According to one or more embodiments of the present disclosure, a display panel and a display device may be provided that are capable of preventing the area of a light emitting area from being reduced and the transmittance of a transmissive area from being lowered by a repair area by employing a structure in which a connection pattern including the repair area is included, and the connection pattern is disposed to overlap the light emitting area.

According to one or more embodiments of the present disclosure, a display panel and a display device may be provided that are capable of simplifying a manufacturing process, minimizing damage caused by etching, and realizing process optimization by employing a structure including a repair pattern, and an active layer included in an electrode included in a light emitting element in a light emitting area.

According to one or more embodiments of the present disclosure, a display panel and a display device may be provided that are capable of being driven with low power by configuring signal lines to extend by a minimum length and thereby enabling minimized signal delay by employing a structure in which a contact hole where a connection pattern and an anode electrode contact each other is located in a concave portion of a storage capacitor.

According to one or more embodiments of the present disclosure, a display panel and a display device may be provided that enable an emission layer of a light emitting element in a light emitting area to be uniformly formed by employing a structure in which an area where a connection pattern and an anode electrode contact each other is located in a central portion of the light emitting area.

BRIEF DESCRIPTION OF THE DRAWINGS

The accompanying drawings, which are included to provide a further understanding of the disclosure and are incorporated in and constitute a part of the disclosure, illustrate aspects of the disclosure and together with the description serve to explain principles of the disclosure.

In the drawings.

DETAILED DESCRIPTION

Figure 1:
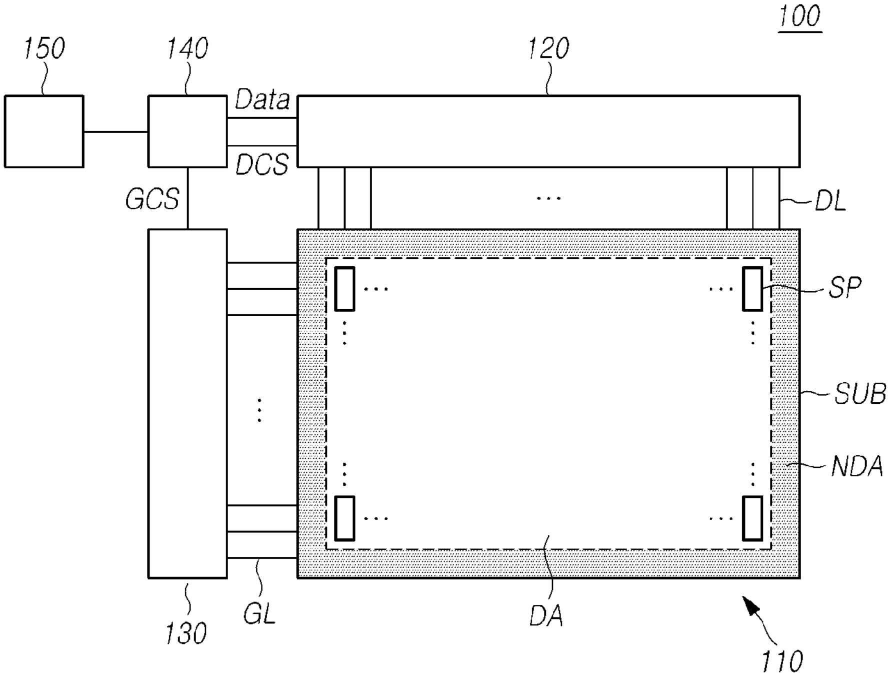
FIG. 1 illustrates an example system configuration of a display device according to embodiments of the present disclosure.

Reference will now be made in detail to embodiments of the present disclosure, examples of which may be illustrated in the accompanying drawings.

In the following description, the structures, embodiments, implementations, methods and operations described herein are not limited to the specific example or examples set forth herein and may be changed as is known in the art, unless otherwise specified. Like reference numerals designate like elements throughout, unless otherwise specified. Names of the respective elements used in the following explanations are selected only for convenience of writing the specification and may thus be different from those used in actual products. Advantages and features of the present disclosure, and implementation methods thereof will be clarified through following example embodiments described with reference to the accompanying drawings. The present disclosure may, however, be embodied in different forms and should not be construed as limited to the example embodiments set forth herein. Rather, these example embodiments are provided so that this disclosure may be sufficiently thorough and complete to assist those skilled in the art to fully understand the scope of the present disclosure. Further, the protected scope of the present disclosure is defined by claims and their equivalents. In the following description, where the detailed description of the relevant known function or configuration may unnecessarily obscure aspects of the present disclosure, a detailed description of such known function or configuration may be omitted. The shapes, sizes, ratios, angles, numbers, and the like, which are illustrated in the drawings to describe various example embodiments of the present disclosure, are merely given by way of example. Therefore, the present disclosure is not limited to the illustrations in the drawings. Where the terms "comprise," "have," "include," "contain," "constitute," "make up of," "formed of," and the like are used, one or more other elements may be added unless the term, such as "only," is used. An element described in the singular form is intended to include a plurality of elements, and vice versa, unless the context clearly indicates otherwise.

Although the terms "first," "second," A, B, (a), (b), and the like may be used herein to describe various elements, these elements should not be interpreted to be limited by these terms as they are not used to define a particular order or precedence. These terms are used only to distinguish one element from another. For example, a first element could be termed a second element, and, similarly, a second element could be termed a first element, without departing from the scope of the present disclosure.

When it is mentioned that a first element "is connected or coupled to", "contacts or overlaps" etc. a second element, it should be interpreted that, not only can the first element "be directly connected or coupled to" or "directly contact or overlap" the second element, but a third element can also be "interposed" between the first and second elements, or the first and second elements can "be connected or coupled to", "contact or overlap", etc. each other via a fourth element. Here, the second element may be included in at least one of two or more elements that "are connected or coupled to", "contact or overlap", etc. each other.

Where positional relationships are described, for example, where the positional relationship between two parts is described using "on," "over," "under," "above," "below," "beside," "next," or the like, one or more other parts may be located between the two parts unless a more limiting term, such as "immediate(ly)," "direct(ly)," or "close(ly)" is used. For example, where an element or layer is disposed "on" another element or layer, a third element or layer may be interposed therebetween. Furthermore, the terms "left," "right," "top," "bottom, "downward," "upward," "upper," "lower," and the like refer to an arbitrary frame of reference.

In addition, when any dimensions, relative sizes etc. are mentioned, it should be considered that numerical values for an elements or features, or corresponding information (e.g., level, range, etc.) include a tolerance or error range that may be caused by various factors (e.g., process factors, internal or external impact, noise, etc.) even when a relevant description is not specified. Further, the term "may" fully encompasses all the meanings of the term "can".

Hereinafter, various embodiments of the present disclosure will be described in detail with reference to the accompanying drawings. In addition, for convenience of description, a scale in which each of elements is illustrated in the accompanying drawings may differ from an actual scale. Thus, the illustrated elements are not limited to the specific scale in which they are illustrated in the drawings.

FIG. 1 illustrates an example system configuration of a display device 100 according to aspects of the present disclosure. Referring to FIG. 1, in one or more embodiments, a display driving system of the display device 100 according to aspects of the present disclosure may include a display panel 110 and a display driving circuit for driving the display panel 110.

The display panel 110 may include a display area DA in which an image is displayed and a non-display area NDA in which an image is not displayed. To display an image, the display panel 110 may include a plurality of subpixels SP disposed on a substrate SUB. For example, the plurality of subpixels SP may be disposed in the display area DA. In one or more embodiments, at least one subpixel SP may be disposed in the non-display area NDA. The at least one subpixel SP disposed in the non-display area NDA may be referred to as a dummy subpixel.

The display panel 110 may include various types of signal lines disposed on the substrate SUB to drive the plurality of subpixels SP. For example, the various types of signal lines may include a plurality of data lines DL for delivering data signals (which may be also referred to as data voltages or image signals), a plurality of gate lines GL for delivering gate signals (which may be also referred to as scan signals), a driving voltage line through a driving voltage is transmitted, and the like.

The plurality of data lines DL and the plurality of gate lines GL may intersect each other. Each of the plurality of data lines DL may extend in a first direction. Each of the plurality of gate lines GL may extend in a second direction intersecting the first direction. For example, the first direction may be a column direction, and the second direction may be a row direction.

The display driving circuit may include a data driving circuit 120, a gate driving circuit 130, and the like, and further include a controller 140 for controlling the data driving circuit 120 and the gate driving circuit 130. The data driving circuit 120 can output data signals (which may be referred to as data voltages) corresponding to image signals to the plurality of data lines DL. The gate driving circuit 130 can generate gate signals and output the generated gate signals to the plurality of gate lines GL. The controller 140 can convert image data inputted from an external device or system such as a host system 150 to a data signal form interpretable by the data driving circuit 120 and supply the image data resulting from the converting to the data driving circuit 120. The controller 140 may supply a data control signal DCS to the data driving circuit 120 to control the data driving circuit 120. The controller 140 may supply a gate control signal GCS to the gate driving circuit 130 to control the gate driving circuit 130.

The data driving circuit 120 may include one or more source driver integrated circuits. In one or more embodiments, the source driver integrated circuit may be connected to the display panel 110 using a tape-automated-bonding (TAB) technique, or connected to a conductive pad such as a bonding pad of the display panel 110 using a chip-on-glass (COG) technique or a chip-on-panel (COP) technique, or connected to the display panel 110 using a chip-on-film (COF) technique.

In one or more embodiments, the gate driving circuit 130 may be connected to the display panel 110 using the tape-automated-bonding (TAB) technique, or connected to a conductive pad such as a bonding pad of the display panel 110 using the chip-on-glass (COG) technique or the chip-on-panel (COP) technique, or formed in the non-display area NDA of the display panel 110 using a gate-in-panel (GIP) technique.

In one or more aspects, the display device 100 may be a display device including a backlight unit such as a liquid crystal display device, or may be a self-emissive display device such as an organic light emitting diode (OLED) display device, a quantum dot (QD) display device, an inorganic light emitting diode display device, and the like. For example, the display device 100 according to aspects of the present disclosure may be an organic light emitting display device implemented with organic light emitting diodes (OLED) as light emitting elements. In another example, the display device 100 according to aspects of the present disclosure may be an inorganic light emitting display device implemented with inorganic material-based light emitting diodes as light emitting elements. In further another example, the display device 100 according to aspects of the present disclosure may be a quantum dot (QD) display device implemented with quantum dots as light emitting elements, which are self-emissive semiconductor crystals.

Figure 2A:
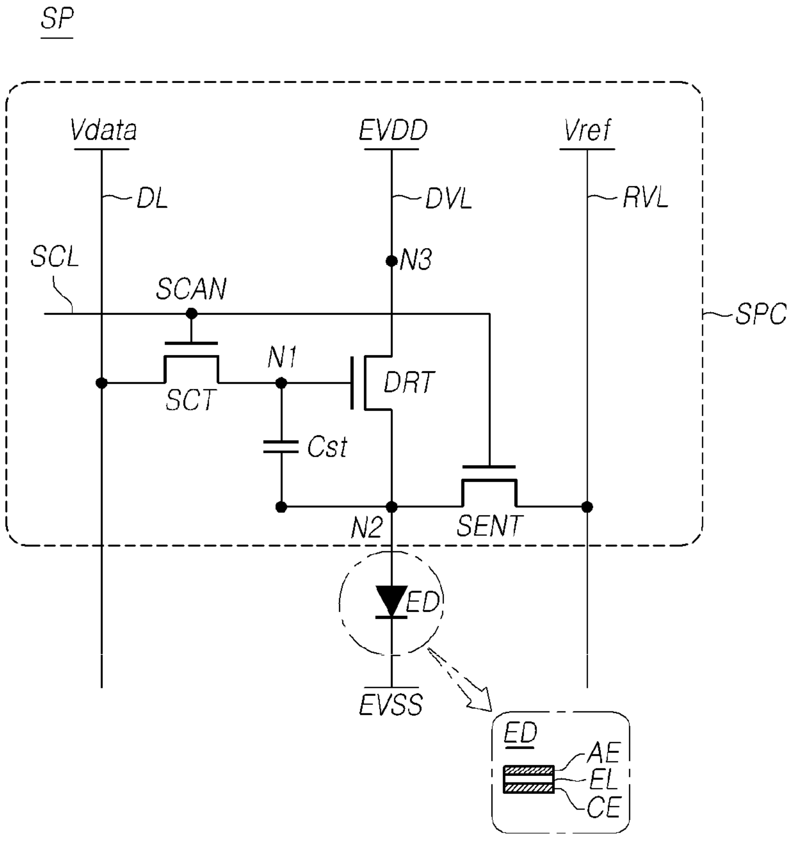
FIGS. 2A and 2B illustrate example equivalent circuits of subpixels included in the display device according to embodiments of the present disclosure.
Figure 2B:
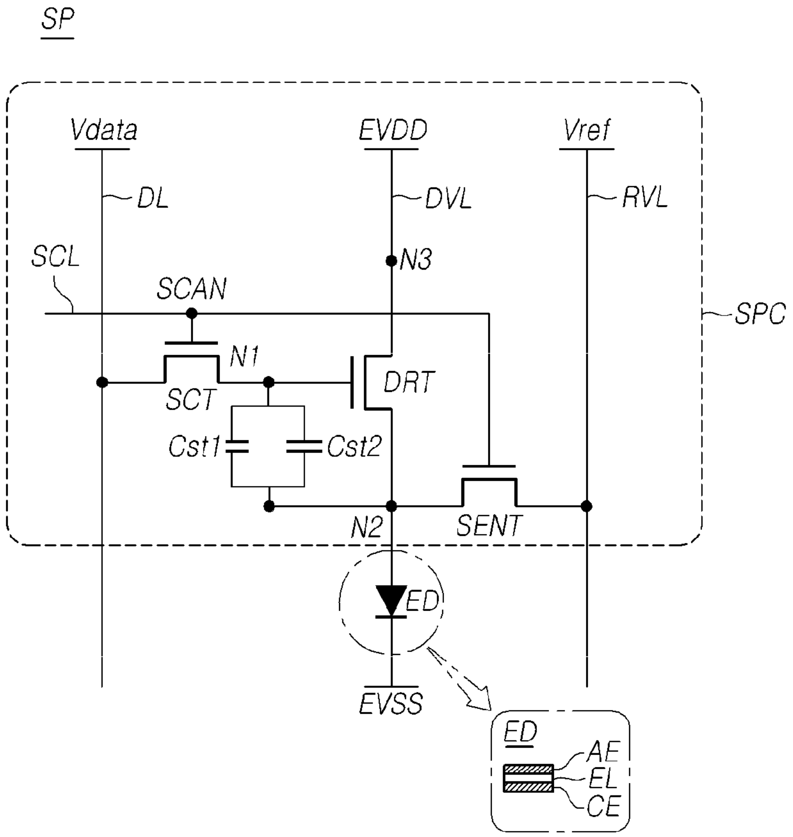

FIGS. 2A and 2B illustrate example equivalent circuits of subpixels SP included in the display device 100 according to aspects of the present disclosure. Referring to FIGS. 2A and 2B, in one or more embodiments, each subpixel SP disposed in the display panel 110 of the display device 100 according to aspects of the present disclosure may include a light emitting element ED, and a pixel driving circuit SPC configured to drive the light emitting element ED. The pixel driving circuit SPC may include a driving transistor DRT, a scan transistor SCT, and a storage capacitor Cst.

The driving transistor DRT can drive the light emitting element ED by controlling a current flowing to the light emitting element ED. The scan transistor SCT can transfer a data voltage Vdata to a first node N1, which is the gate node of the driving transistor DRT. The storage capacitor Cst may be configured to maintain a voltage for a certain period of time.

The light emitting element ED may include a pixel electrode PE and a common electrode CE, and an emission layer EL interposed between the pixel electrode PE and the common electrode CE. The pixel electrode PE may be an anode electrode (or a cathode electrode) and may be electrically connected to a second node N2 of the driving transistor DRT. The common electrode CE may be the cathode electrode (or the anode electrode), and a base voltage EVSS may be applied to the common electrode CE. The light emitting element ED may be, for example, an organic light emitting diode (OLED), a light emitting diode (LED) based on an inorganic material, a quantum dot (QD) light emitting element, a micro light emitting diode, or the like.

The driving transistor DRT may be a transistor for driving the light emitting element ED, and include the first node N1, the second node N2, and a third node N3. The first node N1 of the driving transistor DRT may be the gate node, and be electrically connected to a source node or a drain node of the scan transistor SCT. The second node N2 of the driving transistor DRT may be a source node or a drain node, and be electrically connected to the pixel electrode PE of the light emitting element ED. The third node N3 of the driving transistor DRT may be the drain node or the source node, and may be electrically connected to a driving voltage line DVL for transmitting a driving voltage EVDD. For convenience of description, descriptions that follow will be provided based on examples where the first, second and third nodes (N1, N2 and N3) of the driving transistor DT are gate, source and drain nodes, respectively, unless explicitly stated otherwise. However, it should be understood that the scope of the present disclosure includes examples where the first, second and third nodes (N1, N2 and N3) of the driving transistor DT are gate, drain and source nodes, respectively.

The scan transistor SCT can switch a connection between a data line DL and the first node N1 of the driving transistor DRT. The scan transistor SCT can control a connection between the first node N1 of the driving transistor DRT and a corresponding one of a plurality of data lines in response to a scan signal SCAN delivered through a scan line SCL, which is a type of gate line GL, The drain node or the source node of the scan transistor SCT may be electrically connected to the corresponding data line DL. The source node or the drain node of the scan transistor SCT may be electrically connected to the first node N1 of the driving transistor DRT. The gate node of the scan transistor SCT may be electrically connected to the scan line SCL, and can receive the scan signal SCAN through the scan line SCL. The scan transistor SCT can be turned on by the scan signal SCAN of a turn-on level voltage, and transfer a data voltage Vdata transmitted through the corresponding data line DL to the first node N1 of the driving transistor DRT.

Referring to FIG. 2A, the storage capacitor Cst may be connected between the first node N1 and the second node N2 of the driving transistor DRT.

Referring to FIG. 2B, the storage capacitor Cst may include a first storage capacitor Cst1 and a second storage capacitor Cst2, which are connected in parallel. Although FIG. 2B illustrates an example where two storage capacitors are connected in parallel in the pixel driving circuit SPC, embodiments of the present disclosure are not limited thereto. For example, the pixel driving circuit SPC may include three or more storage capacitors connected in parallel.

Referring to FIGS. 2A and 2B, in one or more embodiments, a respective pixel driving circuit SPC of each subpixel SP included in the display device 100 according to aspects of the present disclosure may further include a sensing transistor SENT. The sensing transistor SENT can switch a connection between the second node N2 of the driving transistor DRT and a reference voltage line RVL through which a reference voltage Vref is transmitted.

The sensing transistor SENT can control a connection between the second node N2 of the driving transistor DRT electrically connected to the pixel electrode PE of the light emitting element ED and a corresponding one of a plurality of reference voltage lines RVL in response to the scan signal SCAN delivered through the scan line SCL. Although FIGS. 2A and 2B illustrate that the gate node of the sensing transistor SENT and the gate node of the scan transistor SCT are connected to the same scan line SCL, but embodiments of the present disclosure are not limited thereto. For example, the gate node of the sensing transistor SENT and the gate node of the scan transistor SCT may be connected to respective scan lines SCL.

The drain node or the source node of the sensing transistor SENT may be electrically connected to the corresponding reference voltage lines RVL. The source node or the drain node of the sensing transistor SENT may be electrically connected to the second node N2 of the driving transistor DRT, and be electrically connected to the pixel electrode PE of the light emitting element ED. The gate node of the sensing transistor SENT may be electrically connected to the scan line SCL, and can receive the scan signal SCAN through the scan line SCL.

Each of the driving transistor DRT, scan transistor SCT, and sensing transistor SENT may be an n-type transistor or a p-type transistor.

Hereinafter, an example structure of the display device 100 according to aspects of the present disclosure will be discussed with reference to FIG. 3.

Figure 3:
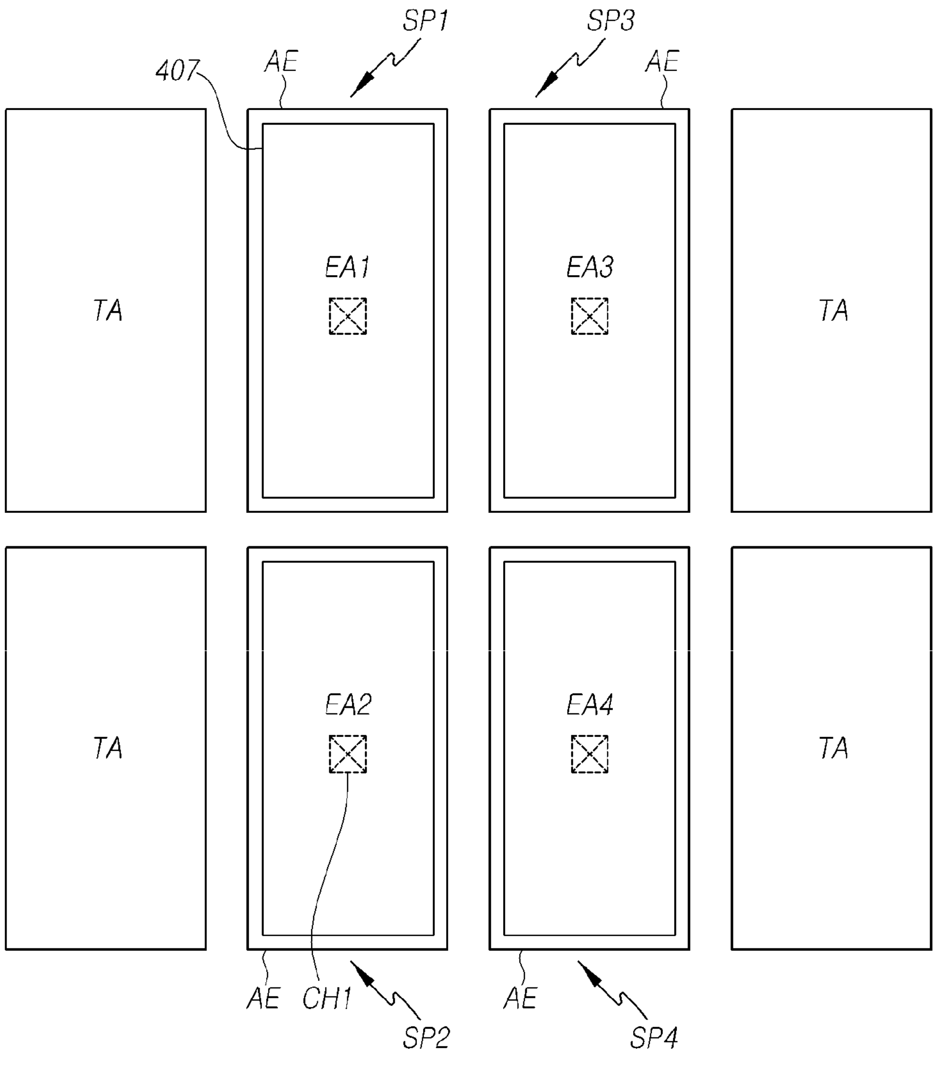
FIG. 3 illustrates an example structure in a plan view in the display device according to embodiments of the present disclosure.

FIG. 3 illustrates an example structure in a plan view in the display device 100 according to aspects of the present disclosure.

Referring to FIG. 3, in one or more aspects, the display device 100 may be a transparent display device. In one or more embodiments, the display device 100 may include at least one transmissive area TA and a non-transmissive area.

The non-transmissive area may be an area where subpixels (SP1, SP2, SP3, and/or SP4) are disposed, be light emitting areas (EA1, EA2, EA3, and/or EA4) of the subpixels (SP1, SP2, SP3, and/or SP4), or be an area where pixel driving circuits SPC of the subpixels (SP1, SP2, SP3, and/or SP4) are disposed. The light emitting areas (EA1, EA2, EA3, and/or EA4) may be defined by a bank 407.

The transmissive area TA may have a transmittance equal to or greater than a predetermined critical transmittance, and may also be referred to as a transparent area. The transmissive area TA may be an area configured to allow external light to be transmitted, and thereby allow a lower portion of, or a portion under, the display panel 110 to be viewed from the front of the display panel 110.

For example, referring to FIG. 3, four subpixels (SP1, SP2, SP3, and SP4) are arranged in two columns. Further, transmissive areas TA may be disposed adjacent to opposing outer edges of two subpixels (e.g., first and third subpixels) among the four subpixels (SP1, SP2, SP3, and SP4, and other transmissive areas TA may be disposed adjacent to opposing outer edges of other two subpixels (e.g., second and fourth subpixels) among the four subpixels (SP1, SP2, SP3, and SP4. The transmissive areas TA may be disposed in a non-light emitting area. Referring to FIG. 3, a respective anode electrode AE may be disposed in each of the four subpixels (SP1, SP2, SP3, and SP4). An emission layer and a cathode electrode (or a common cathode electrode shared by the subpixels) of each light emitting element may be disposed on the respective anode electrode AE.

The anode electrode AE may include a reflective electrode, but embodiments of the present disclosure are not limited thereto.

Each of the four subpixels (SP1, SP2, SP3, and SP4) may include a light emitting area in which light emitted from a corresponding light emitting element is spread out.

For example, as shown in FIG. 3, a first subpixel SP1, a second subpixel SP2, a third subpixel SP3, and a fourth subpixel SP4 may include a first light emitting area EA1, a second light emitting area EA2, a third light emitting area EA3, and a fourth light emitting area EA4, respectively.

Referring to FIG. 3, in one or more embodiments, the display panel 110 of the display device 100 may include a repair area overlapping each of the first to fourth light emitting areas (EA1, EA2, EA3, and EA4).

In one or more embodiments, the respective anode electrode AE disposed in each of the light emitting areas (EA1, EA2, EA3, and EA4) may include a first contact hole CH1 electrically connected to a corresponding circuit area.

The repair area and the first contact hole CH1 may be disposed in at least one light emitting area (EA1, EA2, EA3, and/or EA4). Since the repair area is disposed around the first contact hole CH1, the area of the light emitting areas (EA1, EA2, EA3, and EA4) may not be reduced by the repair area.

Figure 4:
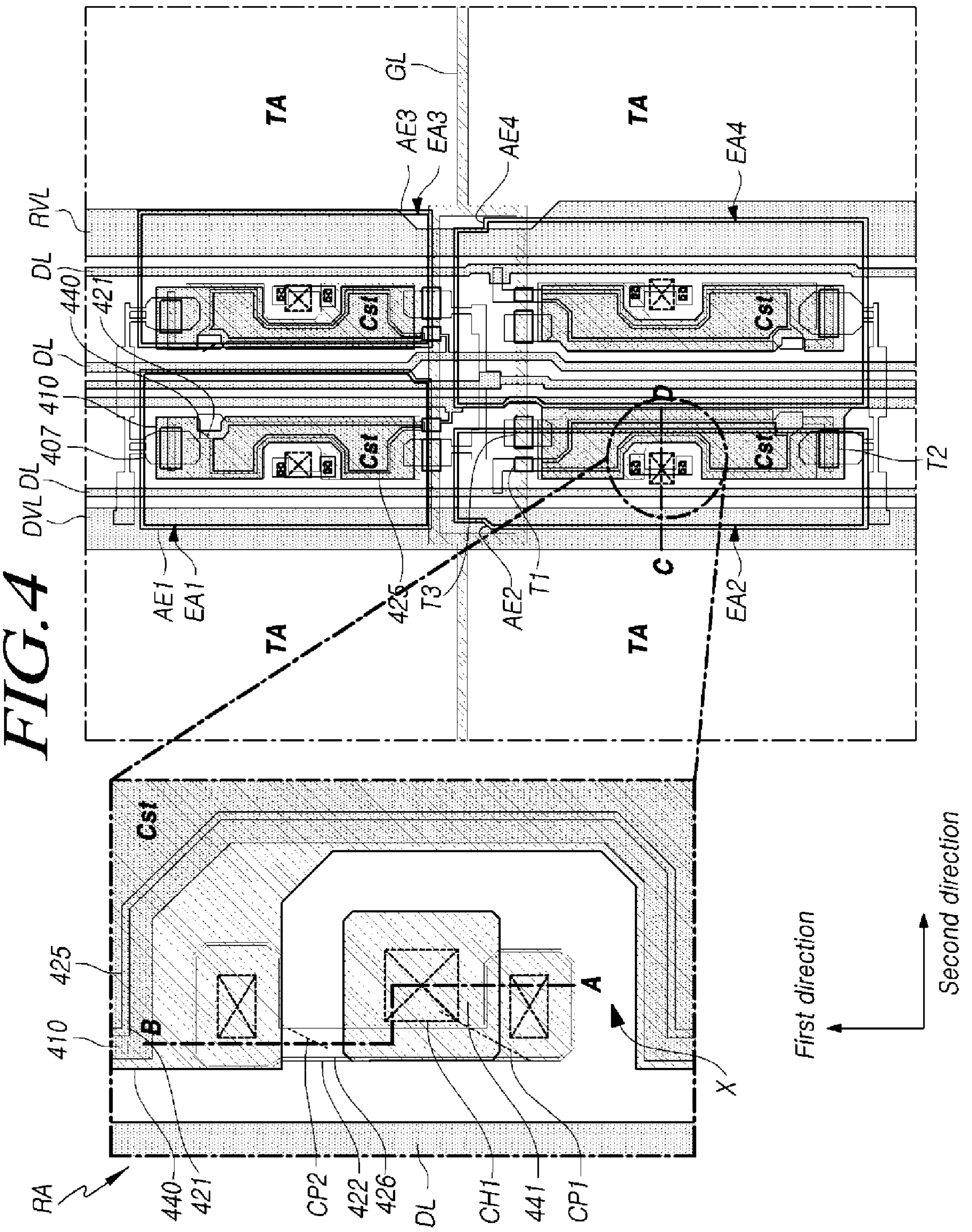
FIG. 4 is a plan view of an example area of the display device according to embodiments of the present disclosure.
Figure 5:
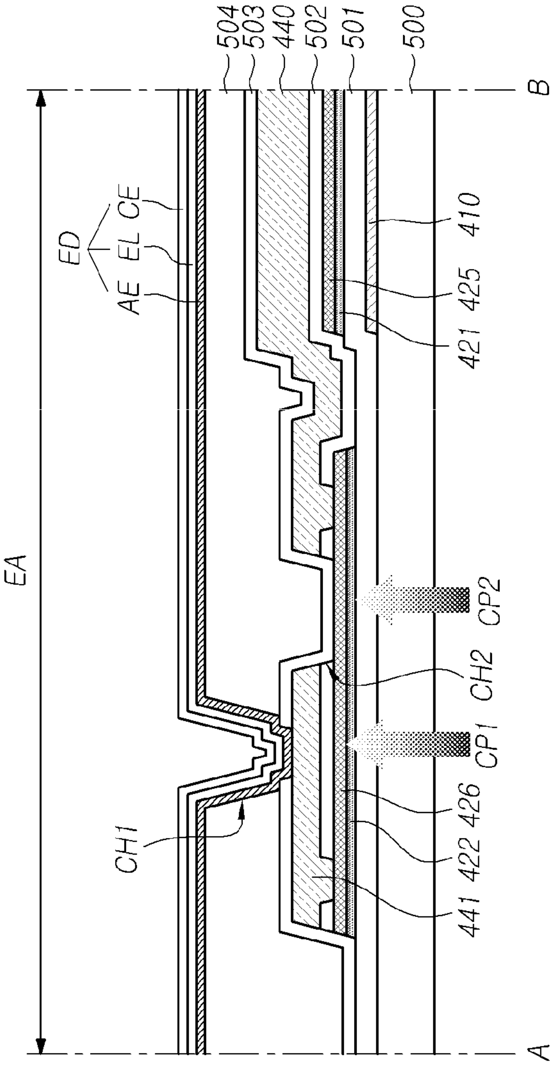
FIG. 5 is an example cross-sectional view taken along line A-B of FIG. 4 according to embodiments of the present disclosure.
Figure 6:
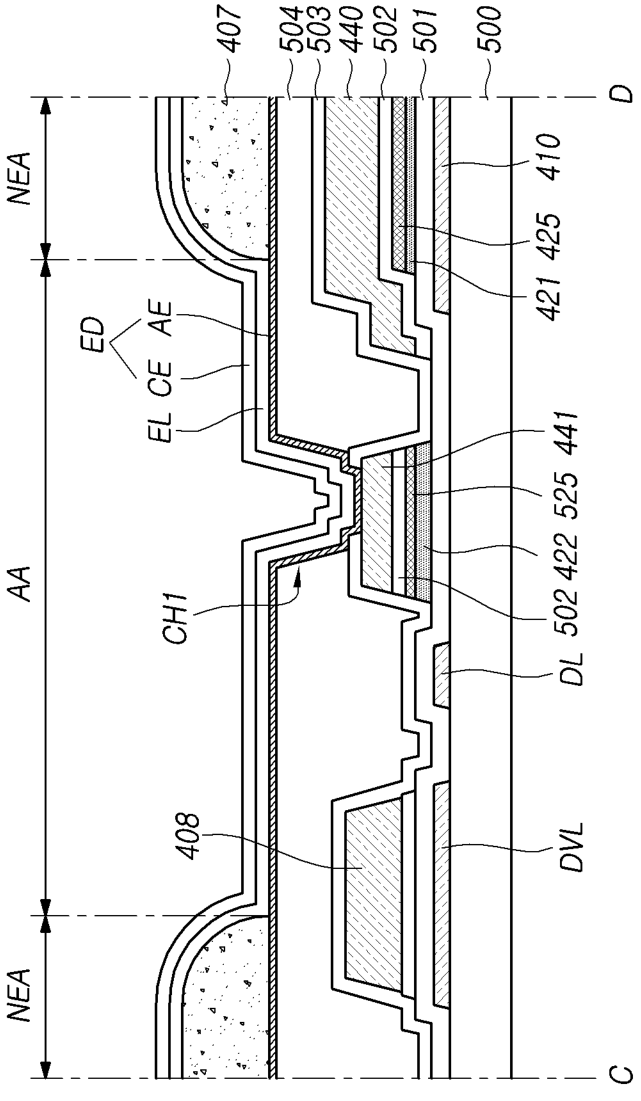
FIG. 6 is an example cross-sectional view taken along line C-D of FIG. 4 according to embodiments of the present disclosure.

The structure of FIG. 3 will be discussed in more detail with reference to FIGS. 4 to 6. FIG. 4 is a plan view of an example area of the display device 100 according to embodiments of the present disclosure. FIG. 5 is an example cross-sectional view taken along line A-B of FIG. 4 according to embodiments of the present disclosure. FIG. 6 is an example cross-sectional view taken along line C-D of FIG. 4 according to embodiments of the present disclosure.

Referring to FIG. 4, opposing outer edges of two light emitting areas (e.g., the first and third light emitting areas) among the first to fourth light emitting areas (EA1, EA2, EA3, and EA4) may be disposed adjacent to transmissive areas TA, respectively, and opposing outer edges of other two light emitting areas (e.g., the second and fourth light emitting areas) among the first to fourth light emitting areas (EA1, EA2, EA3, and EA4) may be disposed adjacent to other transmissive areas TA, respectively.

Referring to FIG. 4, in one or more embodiments, each of the first to fourth light emitting areas (EA1, EA2, EA3, and EA4) may overlap a respective circuit area for driving the corresponding light emitting element.

However, embodiments of the present disclosure are not limited thereto. For example, according to design requirements, at least one light emitting area may not overlap a circuit area for driving the corresponding light emitting element.

Referring to FIG. 4, in one or more embodiments, the display device 100 according to aspects of the present disclosure may include at least one driving voltage line DVL, at least one data line DL, at least one reference voltage line RVL, and at least one gate line GL intersecting the driving voltage line DVL, the data line DL, and reference voltage line RVL.

Referring to FIG. 4, in one or more embodiments, each of the first to fourth light emitting areas (EA1, EA2, EA3, and EA4) may be an area correspond to a respective opening of a bank 207.

Each of the first to fourth light emitting areas (EA1, EA2, EA3, and EA4) may overlap at least a portion of a circuit area including transistors (T1, T2, T3, or T4) for driving the respective light emitting element and a storage capacitor Cst.

The storage capacitor Cst may include a plurality of storage capacitor electrodes. For example, as shown in FIG. 4, the storage capacitor Cst may include a first storage capacitor electrode 410, a second storage capacitor electrode 425, and a third storage capacitor electrode 440.

The first storage capacitor electrode 410 may be disposed in the same layer as the driving voltage line DVL, the data line DL, and the reference voltage line RVL.

The second storage capacitor electrode 425 may be disposed on a first active layer pattern 421 and may be disposed between the first storage capacitor electrode 410 and the third storage capacitor electrode 440.

The third storage capacitor electrode 440 may be disposed in the same layer as the gate line GL.

The circuit area may include a repair area RA electrically connected to the storage capacitor Cst.

At least one repair area RA may be disposed in one subpixel.

The at least one repair area RA may include a first connection pattern 422, a second connection pattern 426 disposed on the first connection pattern 422, and a third connection pattern 441 disposed on the second connection pattern 426.

Portions of the first and second connection patterns 422 and 426 may overlap a portion of the third connection pattern 441.

For example, referring to FIG. 4, the display device may include a first contact hole CH1 overlapping the third connection pattern 441, and the third connection pattern 441 may be connected to an anode electrode of a corresponding light emitting element through the first contact hole CH1.

Referring to FIG. 4, the first connection pattern 422 may be disposed in the same layer as the first active layer pattern 421, the second connection pattern 426 may be disposed in the same layer as the second storage capacitor electrode 425, and the third connection pattern 441 may be disposed in the same layer as the gate line GL.

Referring to FIG. 4, the third connection pattern 441 may be electrically connected to the second connection pattern 426 through a contact hole.

Referring to FIG. 4, the third storage capacitor electrode 440 may be electrically connected to the second connection pattern 426 through a contact hole.

For example, the first connection pattern 422 may be disposed such that it contacts the rear surface of the second connection pattern 426, and the first connection pattern 422 may include at least one cutting area CP.

In the process of manufacturing the display panel 110 included in the display device 100, undesirable substances or particles may be generated in, or introduced into, an electrode of a storage capacitor Cst included in each subpixel, resulting in defects in the corresponding subpixel.

Since the electrodes included in the storage capacitor Cst have a larger area than other components (e.g., electrodes of at least one transistor or an active layer not included in the storage capacitor), therefore, a probability that undesirable substances or particles are generated in, or introduced into, the electrodes of the storage capacitor Cst may increase during the manufacturing process.

In addition, when undesirable substances or particles are generated in, or introduced into, an electrode of a storage capacitor Cst, there may occur a defect in a subpixel in which the corresponding storage capacitor Cst electrode is located.

To address these issues, when undesirable substances or particles are generated in, or introduced into, an electrode of any storage capacitor Cst, and thereby, a defect in a corresponding subpixel occurs, the defective subpixel may be blocked from operating for a repair.

In one or more embodiments, the display device 100 may include the connection patterns (422, 426, and 441) disposed in each subpixel, and at least one cutting area CP in which at least one connection pattern is disposed.

Laser beams can be irradiated to the cutting area CP in which at least one connection pattern is disposed, and since the area in which the laser beams have been irradiated can be electrically disconnected with one or more other elements, a signal cannot be applied to the corresponding subpixel.

For example, referring to FIG. 4, the first connection pattern 422 may include a first cutting area CP1 and a second cutting area CP2, which are repair areas.

As shown in FIG. 4, at least a portion of the first cutting area CP1 may overlap the first contact hole CH1 overlapping the third connection pattern 441.

The second cutting area CP2 may be disposed between the first contact hole CH1 overlapping the third connection pattern 441 and an area where the first and second connection patterns (422 and 426) contact the third storage capacitor electrode 440.

The second cutting area CP2 may be disposed between an area where the first connection pattern 442 contacts the third connection pattern 441 and an area where the first connection pattern 422 contacts the third storage capacitor electrode 440.

Referring to FIG. 4, each of the first cutting area CP1 and the second cutting area CP2 may be disposed within a corresponding light emitting area. Accordingly, the first and second cutting areas CP2, which are areas to be repaired, may be disposed without a loss or reduction in the area (or size) of the light emitting area. That is, effects of increasing a corresponding aperture ratio and extending the remaining lifespan can be obtained.

Referring to FIG. 4, the storage capacitor Cst may include at least one concave portion X on a plane.

For example, the first to third storage capacitor electrodes (410, 425, and 440) disposed in each of the first and third subpixels (SP1 and SP3) may have shapes concavely recessed from the driving voltage line DVL toward the reference voltage line RVL.

For example, the first to third storage capacitor electrodes (410, 425, and 440) disposed in each of the second and fourth subpixels (SP2 and SP4) may have shapes concavely recessed from the reference voltage line DVL toward the driving voltage line RVL.

Referring to FIG. 4, the third connection pattern 441 may be disposed in an area overlapping a concave portion X formed in the first to third storage capacitor electrodes (410, 425, and 440) disposed in each subpixel (SP1, SP2, SP3, and SP4).

The first and second cutting areas (CP1 and CP2) overlapping the first connection pattern 422 and the second connection pattern 426 may be also disposed in the concave portion X formed in the first to third storage capacitor electrodes (410, 425, and 440).

The first contact hole CH1 overlapping the third connection pattern 441 may also overlap the concave portions X formed in the first to third storage capacitor electrodes (410, 425, and 440). Referring to FIG. 4, the first contact hole CH1 may have a structure in which three side surfaces of the first contact hole CH1 are surrounded by first to third storage capacitor electrodes (410, 425, and 440).

Thus, since the third connection pattern 441, the first and second cutting areas (CP1 and CP2), and the first contact hole CH1 are disposed to overlap the concave portion X formed in the first to third storage capacitor electrodes (410, 425, and 440), it is not needed to consider an intentional design to avoid the overlapping of the driving voltage line DVL, the reference voltage line RVL, and the data line DL with the first and second cutting areas (CP1 and CP2) and the first contact hole CH1.

In an example were the first to third storage capacitor electrodes (410, 425, and 440) do not include a concave portion X, the driving voltage line DVL, the reference voltage line RVL, and the data line DL, which extend in a first direction, may include at least one respective portion extending in a direction (e.g., a second direction) intersecting the first direction so that they can be spaced apart from the third connection pattern 441, the first and second cutting areas (CP1 and CP2), and the first contact hole CH1 spaced apart from the first to third storage capacitor electrodes (410, 425, and 440).

Due to this configuration, the lengths of the driving voltage line DVL, the reference voltage line RVL, and the data line DL may become longer. As the lengths of these lines increase, resistance can increase, and thereby, a delay in delivering corresponding signals may occur.

In contrast, in the display device 100 according to embodiments of the present disclosure, since the third connection pattern 441, the first and second cutting areas (CP1 and CP2), and the first contact hole CH1 are disposed in the concave portion X formed in the first to third storage capacitor electrodes (410, 425, and 440), the driving voltage line DVL, the reference voltage line RVL, and the data line DL can have a structure in which they extend in the first direction without being undesirably extended.

As a result, the display device 100 can prevent the resistance of the signal lines extending in the first direction from increasing, and prevent or at least reduce a luminance characteristic from being lowered due to the increased resistance.

Referring to FIG. 5, the storage capacitor Cst and the connection patterns (422, 426, and 441) may be disposed in a light emitting area EA (e.g., the second light emitting area EA2) included in a subpixel (e.g., the second subpixel).

For example, the first storage capacitor electrode 410 may be disposed on a substrate 500. The first storage capacitor electrode 410 may be a light shield layer configured to prevent light from being incident on an active layer.

A buffer layer 501 may be disposed on the first storage capacitor electrode 410.

The first active layer pattern 421 and the first connection pattern 422 may be disposed on the buffer layer 501.

The first active layer pattern 421 and the first connection pattern 422 may include an oxide semiconductor material. The oxide semiconductor material may be a semiconductor material in which the conductivity and bandgap of an oxide material are controlled and adjusted by doping, and may be a transparent semiconductor material having a wide bandgap. For example, the oxide semiconductor material may include indium gallium zinc oxide (IGZO), zinc oxide (ZnO), indium gallium oxide (IGO), indium zinc oxide (IZO), cadmium oxide (CdO), indium oxide (InO), zinc tin oxide (ZTO), zinc indium tin oxide (ZITO), indium gallium zinc tin oxide (IGZTO), and the like.

Referring to FIG. 5, the second storage capacitor electrode 425 may be disposed on the first active layer pattern 421, and the second connection pattern 426 may be disposed on the first connection pattern 422.

The second storage capacitor electrode 425 and the second connection pattern 426 may include a conductive material, for example, metal. The second storage capacitor electrode 425 and the second connection pattern 426 may include copper (Cu), aluminum (Al), molybdenum (Mo), titanium (Ti), or molybdenum-titanium (MoTi), but embodiments of the present disclosure are not limited thereto.

Referring to FIG. 5, a gate insulating layer 502 may be disposed over the substrate 500 over which the second storage capacitor electrode 425 and the second connection pattern 426 are disposed.

Referring to FIG. 5, the gate insulating layer 502 may include a plurality of holes.

For example, the gate insulating layer 502 may include at least three holes exposing portions of an upper surface of the second connection pattern 426.

Referring to FIG. 5, the third storage capacitor electrode 440 and the third connection pattern 441 may be disposed on the gate insulating layer 502.

The third storage capacitor electrode 440 and the third connection pattern 441 may be spaced apart from each other.

The third storage capacitor electrode 440 may be disposed to overlap the first storage capacitor electrode 410 and the second storage capacitor electrode 425.

Referring to FIG. 5, the third storage capacitor electrode 440 may contact a portion of the upper surface of the second connection pattern 426 through a hole formed in the gate insulating layer 502.

The third connection pattern 441 may overlap the first connection pattern 422 and the second connection pattern 426.

Referring to FIG. 5, the third connection pattern 441 may contact a portion of the upper surface of the second connection pattern 426 through a hole formed in the gate insulating layer 502.

Referring to FIG. 5, the gate insulating layer 502 may include a second contact hole CH2 exposing a portion of the upper surface of the second connection pattern 426.

A passivation layer 503 may be disposed over the substrate 500 over which the third storage capacitor electrode 440 and the third connection pattern 441 are disposed.

The passivation layer 503 may also be disposed in the second contact hole CH2 of the gate insulating layer 502.

An overcoat layer 504 may be disposed on the passivation layer 503.

The passivation layer 503 may be an insulating layer containing an inorganic insulating material, and the overcoat layer 502 may be an insulating layer containing an organic insulating material.

Referring to FIG. 5, a first contact hole CH1 exposing a portion of an upper surface of the third connection pattern 441 may be formed in the passivation layer 503 and the overcoat layer 504.

An anode electrode AE of a corresponding light emitting element may be disposed on the overcoat layer 504. An emission layer EL and a cathode electrode CE may be disposed on the anode electrode AE.

The anode electrode AE may contact the portion of the upper surface of the third connection pattern 441 through the first contact hole CH1. The third connection pattern 441 may overlap at least respective portions of the first connection pattern 422 and the second connection pattern 426.

Accordingly, the anode electrode AE can be electrically connected to the third connection pattern 441, and the third connection pattern 441 can be electrically connected to the storage capacitor Cst through the second connection pattern 426.

Meanwhile, considering that a defect occurs in a subpixel, there may be applied a structure in which an anode electrode AE and a signal line are extended to a transmissive area TA for repair, and the anode electrode AE and the signal line contact each other in the transmissive area TA. However, according to this structure, the transmittance of the transmissive area TA can decrease because respective portions of the anode electrode AE and the signal line are disposed in the transmissive area TA. In addition, as the anode electrode AE and the signal line extend to the transmission area TA, the anode electrode AE and the signal line contacting the anode electrode AE may overlap other signal lines or electrodes, and thereby, parasitic capacitance may be additionally caused.

In contrast, in the display device 100 according to embodiments of the present disclosure, since the first contact hole CH1 through which the third connection pattern 441 and the anode electrode AE contact each other is disposed in the light emitting area EA, the transmittance of the transmissive area TA can be prevented from lowering. Further, an increase in parasitic capacitance can be prevented, and thereby, a delay in supplying corresponding signals can be prevented.

In one or more embodiments, the display device 100 may include at least one cutting area CP disposed in the light emitting area EA.

For example, one light emitting area EA may include a first cutting area CP1 and a second cutting area CP2 spaced apart from the first cutting area CP1.

The first cutting area CP1 and the second cutting area CP2 may overlap the first connection pattern 422 and the second connection pattern 426.

Referring to FIG. 5, in one or more embodiments, the first cutting area CP1 may overlap respective portions of the first connection pattern 422, the second connection pattern 426, and the third connection pattern 441.

In one or more embodiments, at least a portion of the first cutting area CP1 may overlap at least a portion of the first contact hole CH1.

Referring to FIG. 5, in one or more embodiments, the second cutting area CP2 may overlap the first connection pattern 422 and the second connection pattern 426, but may not overlap the third connection pattern 441. In one or more embodiments, the second cutting area CP2 may not overlap the first to third storage capacitor electrodes (410, 425, and 440).

In one or more embodiments, at least a portion of the second cutting area CH2 may overlap the second contact hole CH2.

In the second cutting area CH2, an upper surface of the second connection pattern 426 may contact the passivation layer 503 and a rear surface of the second connection pattern 426 may contact the first connection pattern 422. In one or more embodiments, in the second cutting area CH2, the rear surface of the first connection pattern 422 may contact the buffer layer 501.

When a defect occurs in at least one of the portions of the light emitting area EA overlapping the cutting areas (CP1 and CP2), laser beams can be irradiated to the first connection pattern 422 disposed in the at least one cutting area (CP1 and/or CP2). Thereby, an electrical connection between the first and second connection patterns (422 and 426) and the third storage capacitor electrode 440 can be disconnected.

In this manner, since the cutting areas (CP1 and CP2) for repairing a corresponding subpixel are arranged to overlap the light emitting area EA, the repair area can be provided without a reduction in an aperture ratio.

Further, since the cutting areas (CP1 and CP2) are located in the light emitting area EA, the transmittance of the display device 100 including the transmissive area may not be reduced.

Referring to FIG. 6, one subpixel may include a light emitting area EA and a non-light emitting area NEA.

The light emitting area EA and the non-light emitting area NEA may be defined by a bank 407.

In the display area, an area where the bank 407 is disposed may be the non-light emitting area NEA, and an area where the bank 407 is not disposed may be the light emitting area EA.

Referring to FIG. 6, a plurality of connection patterns (e.g., 422, 426, and 441) and the first contact hole CH1 through which the connection patterns (422, 426, and 441) and an anode electrode AE of a corresponding light emitting area AA of at least one subpixel contact each other may be disposed in the light emitting area EA.

Further, at least one signal line may be disposed in the light emitting area EA.

For example, referring to FIG. 6, at least one data line DL may be disposed in the light emitting area EA, and a portion of a driving voltage line DVL may also be disposed in the light emitting area EA. The driving voltage line DVL may overlap an electrode 408 formed of the same material as the third storage capacitor electrode 440.

Referring to FIG. 6, a first portion of the storage capacitor Cst including the first to third storage capacitor electrodes (410, 425, and 440) may be disposed in the light emitting area EA, and the remaining portion of the storage capacitor Cst except for the first portion may be disposed in the non-light emitting area NEA. A first connection pattern 422 may be disposed in the first contact hole and may be formed of a material included in the first active layer pattern 421. Some 525 of the plurality of connection patterns may be disposed in the first contact hole and may be formed of a material included in the second storage capacitor electrode 425. A gate insulating layer 502 may be disposed on some 525 of the plurality of connection patterns, and a third connection pattern 441 may be disposed on the gate insulating layer 502.

As described above, since the components needed for driving the light emitting element ED are disposed to overlap the light emitting area EA, the area of the light emitting area EA can be prevented from being reduced due to the components for driving the light emitting element ED.

Further, since at least respective portions of one or more transistors, the storage capacitor Cst, and the signal lines, which are needed to drive the light emitting element ED, do not overlap an adjacent transmissive area TA, the transmittance of the display device 100 can be improved.

Referring to FIGS. 4 and 5, in one or more embodiments, the first contact hole CH1 of the display device 100 according to aspects of the present disclosure may be disposed in a central portion of one light emitting area EA.

For example, on a plane, the first contact hole CH1 may be located in the central portion of the light emitting area EA in which the first contact hole CH1 is located in the first direction.

In another example, on a plane, the first contact hole CH1 may be located in the central portion of the light emitting area EA in which the first contact hole CH1 is located in the second direction.

In further another example, on a plane, the first contact hole CH1 may be located in the central portion of the light emitting area EA in which the first contact hole CH1 is located in the first and second directions.

According to these examples, the first contact hole CH1 may be disposed sufficiently spaced from the bank 407.

Referring to FIGS. 5 and 6, the anode electrode AE, the emission layer EL, and the cathode electrode CE of the light emitting element ED may be disposed in the first contact hole CH1.

As shown in FIG. 4, since the first contact hole CH1 is disposed in the central portion of each of the light emitting areas (EA1, EA2, EA3, and EA4), the first contact hole CH1 can be disposed away from the bank 407, and the anode electrode AE, the emission layer EL, and the cathode electrode CE, which are disposed in the first contact hole CH1, may not have a step due to the bank 407.

As a result, the thicknesses of the anode electrode AE, the emission layer EL, and the cathode electrode CE can be uniform in each light emitting area (EA1, EA2, EA3, and EA4) where the first contact hole CH1 is disposed, and luminance characteristics of the light emitting areas (EA1, EA2, EA3, and EA4) can be uniform.

Although FIGS. 4 to 6 illustrate that the first cutting area CP1 and the second cutting area CP2 are formed based on the first connection pattern 422, but embodiments of the present disclosure are not limited thereto. For example, respective locations of one or more cutting areas may be formed differently from those of FIGS. 4 to 6 according to design considerations.

In an example, one subpixel may include a cutting area located at a different location from the first cutting area CP1 and the second cutting area CP2, which are repair areas. This configuration will be discussed below with reference to FIG. 7.

Figure 7:
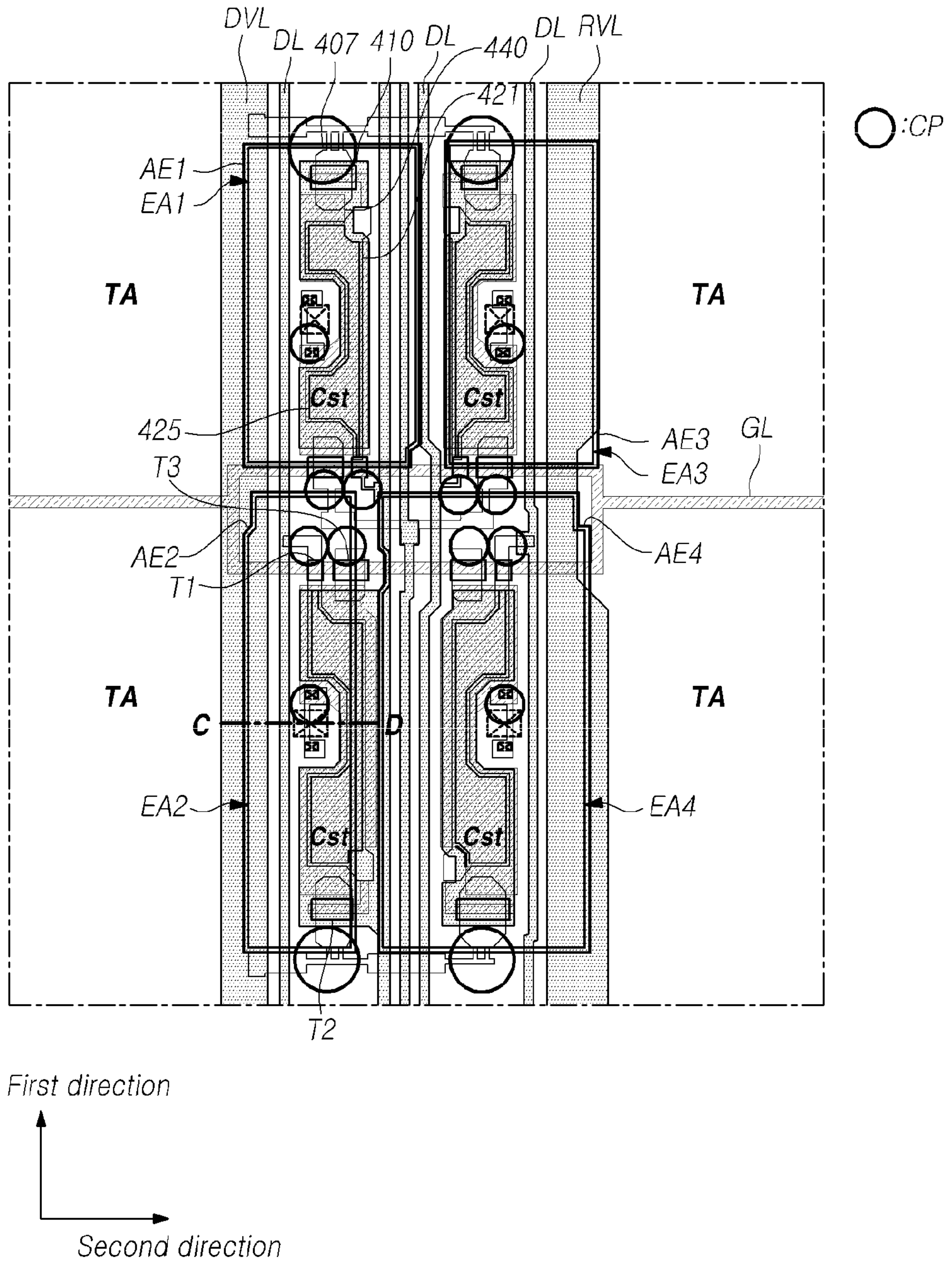
FIG. 7 illustrates an example repair area located in a display area of the display device according to embodiments of the present disclosure.

FIG. 7 illustrates an example repair area located in the display area of the display device 100 according to aspects of the present disclosure.

Referring to FIG. 7, in one or more embodiments, at least one subpixel disposed in the display area of the display device may include at least one additional cutting area, in addition to a first cutting area CP1 and a second cutting area CP2.

For example, as shown in FIG. 7, at least one subpixel may include a cutting area formed in an active layer of a first transistor T1. The first transistor T1 may be a driving transistor.

In one or more embodiments, the at least one subpixel may include another cutting area formed in an active layer of a second transistor T2. The second transistor T2 may be a scan transistor. The active layer of the second transistor T2 may have the same configuration as the first active layer pattern 421 and the second storage capacitor electrode 425 of the storage capacitor Cst of FIG. 4.

In one or more embodiments, the at least one subpixel may include further another cutting area formed in an active layer of a third transistor T3. The third transistor T3 may be a sensing transistor.

The respective cutting areas of the active layer of the first transistor T1, the active layer of the second transistor T2, and the active layer of the third transistor T3 may be disposed only in a corresponding light emitting area EA, or at least respective portions of the cutting areas may be disposed in the non-light emitting area.

The active layer of the first transistor T1, the active layer of the second transistor T2, and the active layer of the third transistor T3 may have a stack of multiple layers. For example, the active layers may include an oxide semiconductor material layer and a metal layer disposed on the oxide semiconductor material layer.

As such, since the active layers include the cutting areas, the repair process can be performed using laser beams having a shorter wavelength than a repair pattern using a metal layer.

In one or more embodiments, the third storage capacitor electrode 440 or the third connection pattern 441 may not be disposed on the cutting area of the active layers.

In one or more embodiments, the first storage capacitor electrode 410 may not be disposed under the active layers.

Accordingly, the power of a laser used during the process can be reduced, and thereby, damage to other components due to the laser can be prevented. As a result, it is not necessary to dispose an additional margin area considering such damage. Indeed, the aperture ratio can be improved as such a margin area can be utilized as a light emitting area.

Hereinafter, an example structure of the display device 100 according to aspects of the present disclosure will be discussed with reference to FIGS. 8, 9, and 10.

Figure 8:
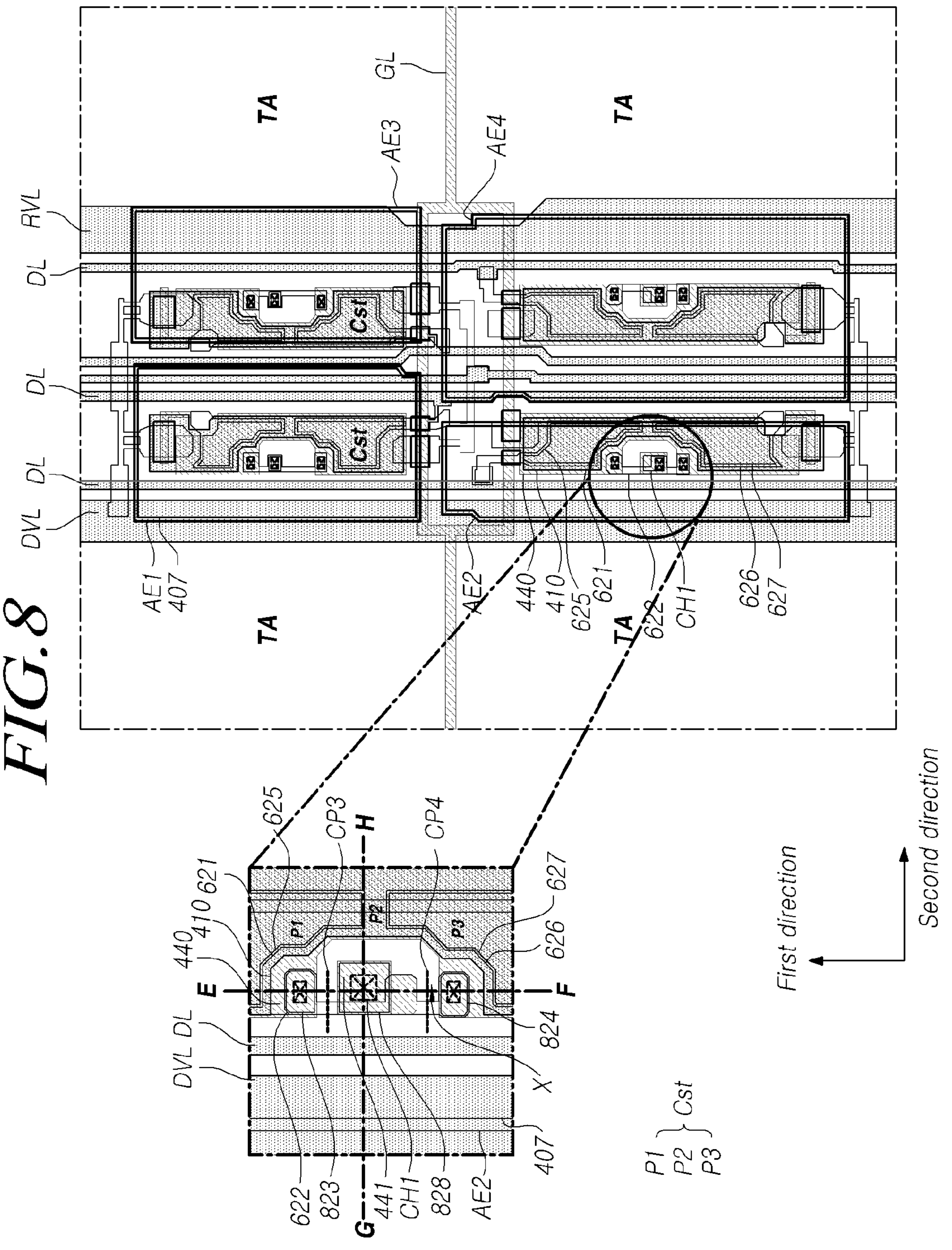
FIG. 8 illustrates an example light emitting area, an example non-light emitting area, and an example transmissive area in a plan view in the display device according to embodiments of the present disclosure.

FIG. 8 illustrates an example light emitting area, an example non-light emitting area, and an example transmissive area in a plan view in the display device 100 according to embodiments of the present disclosure. FIG. 9 is an example cross-sectional view taken along line E-F of FIG. 8. FIG. 10 is an example cross-sectional view taken along line G-H of FIG. 8 according to embodiments of the present disclosure.

Figure 9:
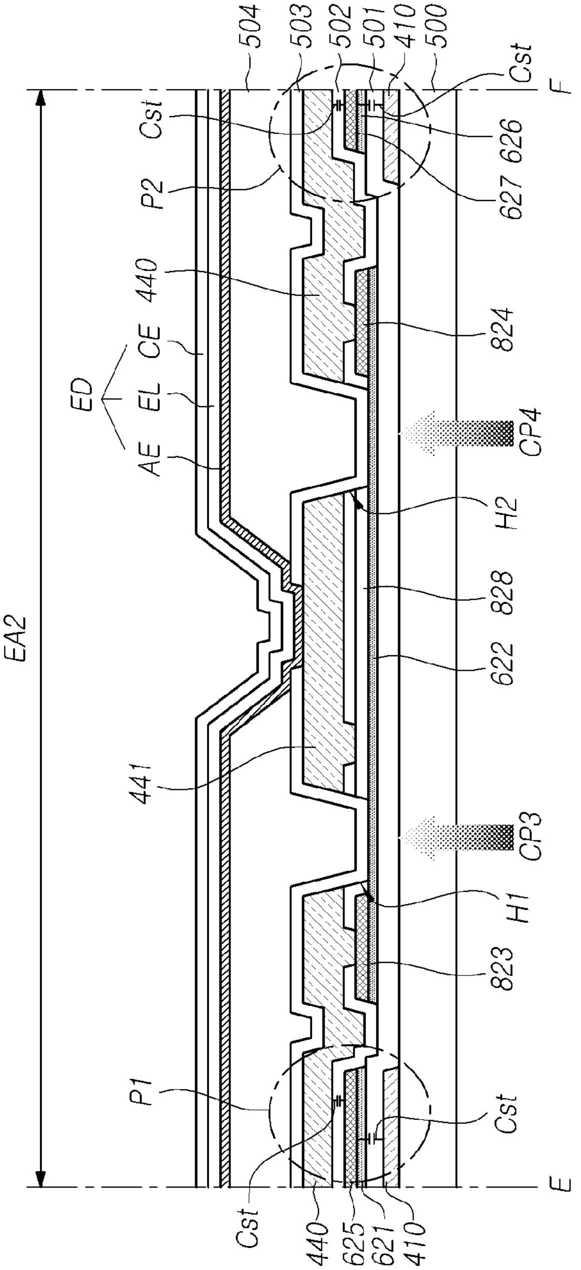
FIG. 9 is an example cross-sectional view taken along line E-F of FIG. 8 according to embodiments of the present disclosure.
Figure 10:
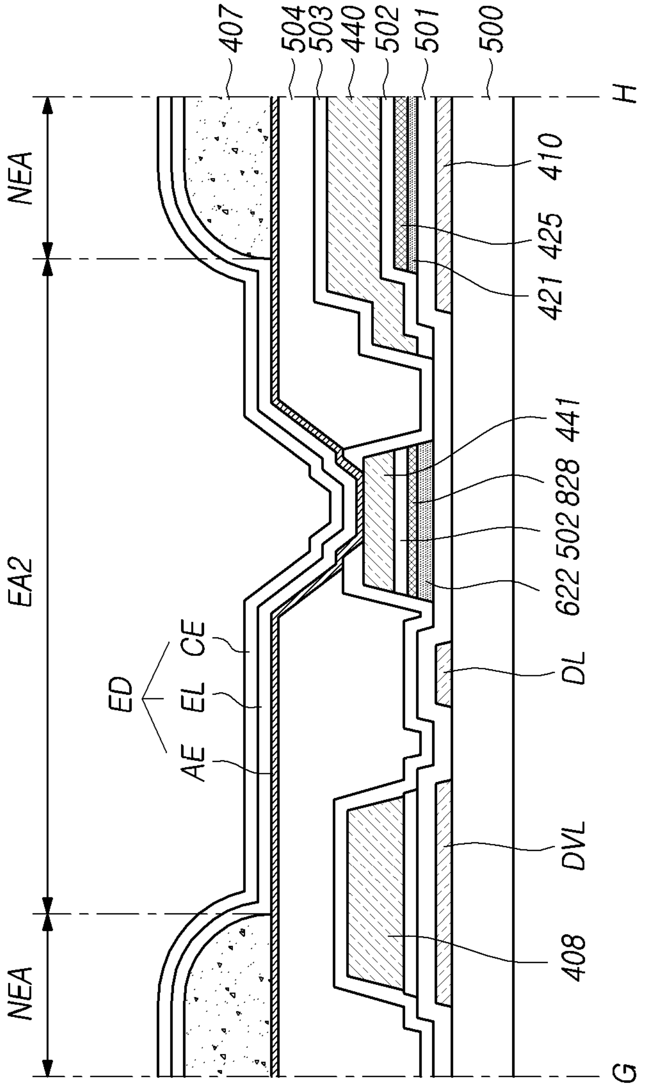
FIG. 10 is an example cross-sectional view taken along line G-H of FIG. 8 according to embodiments of the present disclosure.

Referring to FIGS. 8 to 10, in one or more embodiments, the display device according to embodiments of the present disclosure may include a circuit area overlapping each of light emitting areas (EA1, EA2, EA3, and EA4).

The circuit area may include a plurality of transistors (T1, T2, and T3) and a storage capacitor Cst, which are needed to drive a corresponding light emitting element ED.

A first contact hole CH1 may be disposed in the circuit area overlapping each of the light emitting areas (EA1, EA2, EA3, and EA4).

The first contact hole CH1 may be disposed in a central portion of each of the light emitting areas (EA1, EA2, EA3, and EA4).

Hereinafter, for convenience of description, one light emitting area and a non-light emitting area NEA surrounding the light emitting area will be discussed based on a second light emitting area EA2 and a non-light emitting area NEA surrounding the second light emitting area EA2.

Referring to FIG. 8, in one or more embodiments, each subpixel of the display device according to aspects of the present disclosure may include at least one storage capacitor Cst, and the at least one storage capacitor Cst may include a first storage capacitor part P1, a second storage capacitor part P2, and a third storage capacitor part P3.

The first storage capacitor part P1 and the second storage capacitor part P2 may include three storage capacitor electrodes, and the third storage capacitor part P3 may include two storage capacitor electrodes.

Referring to FIG. 8, a portion of the third storage capacitor part P3 may be surrounded by the first storage capacitor part P1 and the second storage capacitor part P2.

For example, the first storage capacitor part P1 may include a lower storage capacitor electrode 410 (which may be the same as the first storage capacitor electrode of FIG. 4), a first intermediate storage capacitor electrode 625, and an upper storage capacitor electrode 440 (which may be the same as the third storage capacitor electrode of FIG. 4).

The second storage capacitor part P2 may include the lower storage capacitor electrode 410, a second intermediate storage capacitor electrode 627, and the upper storage capacitor electrode 440.

The third storage capacitor part P3 may include the lower storage capacitor electrode 410 and the upper storage capacitor electrode 440.

That is, the first to third storage capacitor parts (P1, P2, and P3) may have a structure in which the lower storage capacitor electrode 410 and the upper storage capacitor electrode 440 are shared.

The first intermediate storage capacitor electrode 625 and the second intermediate storage capacitor electrode 627 may be spaced apart from each other.

At least one repair area RA may be disposed in one subpixel. The repair area RA may include at least one cutting area CP.

For example, a first connection pattern 622, first, second, and third sub-connection patterns (823, 824, and 828), which are disposed on the upper surface of the first connection pattern 622 and spaced apart from each other, and a third connection pattern 441 disposed on the third sub-connection pattern 828 (or a second connection pattern) may be disposed over the substrate 500.

The first connection pattern 622 may be disposed in the same layer as a second active layer pattern 621 disposed under the first intermediate storage capacitor electrode 625 and a third active layer pattern 626 disposed under the second intermediate storage capacitor electrode 627.

The first to third sub-connection patterns (823, 824, and 828) may be disposed in the same layer as the first and second intermediate storage capacitor electrodes (625 and 627).

The third connection pattern 441 may be disposed in the same layer as the upper storage capacitor electrode 440.

Referring to FIG. 8, in one or more embodiments, the first sub-connection pattern 823 disposed on the first connection pattern 622 may contact the upper storage capacitor electrode 440. In one or more embodiments, the second sub-connection pattern 824 disposed on the first connection pattern 622 may also contact the upper storage capacitor electrode 440.

Referring to FIG. 8, at least one side of the first sub-connection pattern 823 may be spaced apart from the first intermediate storage capacitor electrode 625 and surrounded by the first intermediate storage capacitor electrode 625.

At least one side of the second sub-connection pattern 824 may be spaced apart from the second intermediate storage capacitor electrode 627 and surrounded by the second intermediate storage capacitor electrode 627.

Referring to FIG. 8, the storage capacitor Cst may include at least one concave portion X on a plane.

In one or more embodiments, at least one subpixel may include at least one cutting area (CP3 and/or CP4) overlapping at least one corresponding light emitting area, and the at least one cutting area (CP3 and/or CP4) may be present in the first connection pattern 622.

For example, referring to FIG. 8, at least one subpixel may include a third cutting area CP3 and a fourth cutting area CP4 spaced apart from each other.

The third and fourth cutting areas (CP3 and CP4) may be disposed in the concave portion X of the storage capacitor Cst.

Referring to FIG. 8, in one or more embodiments, the display device according to aspects of the present disclosure may include a first contact hole CH1 overlapping the third connection pattern 441, and the third connection pattern 441 may be connected to an anode electrode of a corresponding light emitting element through the first contact hole CH1.

The first contact hole CH1 may overlap a portion of the third sub-connection pattern 828 disposed under the third connection pattern 441 and a portion of the first connection pattern 622 disposed under the third sub-connection pattern 828.

The third cutting area CP3 may be located in an area between the first sub-connection pattern 823 and the third sub-connection pattern 828, and the fourth cutting area CP4 may be located in an area between the second sub-connection pattern 824 and the third sub-connection pattern 828.

When undesirable substances or particles are generated in, or introduced into, the first storage capacitor part P1 of at least one subpixel, laser beams can be irradiated to the third cutting area CP3, and thereby, an electrical connection between the first connection pattern 622 and the first storage capacitor part P1 can be disconnected.

In this situation, even when the first connection pattern 622 and the first storage capacitor part P1 are electrically disconnected, the first connection pattern 622 may be in a state electrically connected to the second storage capacitor part P2.

When undesirable substances or particles are generated in, or introduced into, the second storage capacitor part P2 of at least one subpixel, laser beams can be irradiated to the fourth cutting area CP4, and thereby, an electrical connection between the first connection pattern 622 and the second storage capacitor part P2 can be disconnected.

In this situation, even when the first connection pattern 622 and the second storage capacitor part P2 are electrically disconnected, the first connection pattern 622 may be in a state electrically connected to the first storage capacitor part P1.

Therefore, even when undesirable substances or particles are generated in, or introduced into, one of the first storage capacitor part P1 and the second storage capacitor part P2, since the storage capacitor Cst can normally operate by the other through the repair of the first connection pattern 622, the display device 100 can provide a structure in which the corresponding subpixel in which undesirable substances or particles are generated or introduced can emit light normally.

As shown in FIG. 8, since the first contact hole CH1 is disposed in the central portion of each of the light emitting areas (EA1, EA2, EA3, and EA4), the first contact hole CH1 can be disposed away from the bank 407, and the anode electrode AE, the emission layer EL, and the cathode electrode CE, which are disposed on the first contact hole CH1, may not have a step due to the bank 407.

As a result, the thicknesses of the anode electrode AE, the emission layer EL, and the cathode electrode CE can be uniform in each light emitting area (EA1, EA2, EA3, and EA4) where the first contact hole CH1 is disposed, and luminance characteristics of the light emitting areas (EA1, EA2, EA3, and EA4) can be uniform.

Referring to FIG. 9, the first storage capacitor part P1, the second storage capacitor part P2, and the connection patterns (622, 626, and 441) may be disposed in the light emitting area EA2.

For example, the lower storage capacitor electrode 410 may be disposed on the substrate 500.

A buffer layer 501 may be disposed on the lower storage capacitor electrode 410.

The first connection pattern 622, the second active layer pattern 621, and the third active layer pattern 626 may be disposed on the buffer layer 501.

The first connection pattern 622, the second active layer pattern 621, and the third active layer pattern 626 may include an oxide semiconductor material. For example, the oxide semiconductor material may include indium gallium zinc oxide (IGZO), zinc oxide (ZnO), indium gallium oxide (IGO), indium zinc oxide (IZO), cadmium oxide (CdO), indium oxide (InO), zinc tin oxide (ZTO), zinc indium tin oxide (ZITO), indium gallium zinc tin oxide (IGZTO), and the like.

Referring to FIG. 9, the first intermediate storage capacitor electrode 625 may be disposed on the second active layer pattern 621, and the second intermediate storage capacitor electrode 627 may be disposed on the third active layer pattern 626.

A second connection pattern 828 may be disposed on the first connection pattern 622.

Each of the first intermediate storage capacitor electrode 625, the second intermediate storage capacitor electrode 627, and the second connection pattern 828 may include a conductive material, such as metal. The first intermediate storage capacitor electrode 625, the second intermediate storage capacitor electrode 627, and the second connection pattern 828 may include copper (Cu), aluminum (Al), molybdenum (Mo), titanium (Ti), or molybdenum-titanium (MoTi), but embodiments of the present disclosure are not limited thereto.

Referring to FIG. 9, a gate insulating layer 502 may be disposed over the substrate 500 over which the first intermediate storage capacitor electrode 625, the second intermediate storage capacitor electrode 627, and the second connection pattern 828 are disposed.

Referring to FIG. 9, the gate insulating layer 502 may include a plurality of holes.

For example, the gate insulating layer 502 may include at least two holes (H1 and H2) exposing portions of an upper surface of the first connection pattern 622. For example, the gate insulating layer 502 may include a first hole H1 and a second hole H2 overlapping the first connection pattern 622.

Referring to FIG. 9, the upper storage capacitor electrode 440 and third connection pattern 441 may be disposed on the gate insulating layer 502.

The upper storage capacitor electrode 440 and third connection pattern 441 may be spaced apart from each other.

The upper storage capacitor electrode 440 may be disposed to overlap the lower storage capacitor electrode 410 and the first and second intermediate storage capacitor electrodes (625 and 626).

Referring to FIG. 9, the upper storage capacitor electrode 440 may contact respective portions of the upper surfaces of the first and second sub-connection patterns (823 and 824) through holes formed in the gate insulating layer 502.

The third connection pattern 441 may overlap the first connection pattern 622 and the third sub-connection pattern 828.

Referring to FIG. 9, the third connection pattern 441 may contact a portion of the upper surface of the third sub-connection pattern 828 through a hole formed in the gate insulating layer 502.

Referring to FIG. 9, the upper storage capacitor electrode 440 and the third connection pattern 441 may not overlap the first and second holes H1 and H2 of the gate insulating layer 502.

Referring to FIG. 9, portions of the gate insulating layer 502 in which the first and second holes H1 and H2 are formed may overlap the third cutting area CP3 and the fourth cutting area CP4.

When a corresponding subpixel is repaired, laser beams can be irradiated to the first connection pattern 622 located in the third cutting area CP3 or the fourth cutting area CP4.

Referring to FIG. 9, when the subpixel is repaired, laser beams can be irradiated to the third cutting area CP3 and the fourth cutting area, and portions of the first connection pattern 622 located in the cutting areas irradiated with the laser can be cut off.

A passivation layer 503 may be disposed over the substrate 500 over which the upper storage capacitor electrode 440 and the third connection pattern 441 are disposed.

The passivation layer 503 may also be disposed in the first and second holes (H1 and H2) of the gate insulating layer 502.

Referring to FIG. 9, in areas where the first and second holes (H1 and H2) are formed, the rear surface and the upper surface of the first connection pattern 622 may contact the buffer layer 501 and the passivation layer 503, respectively.

An overcoat layer 504 may be disposed on the passivation layer 503.

The first contact hole CH1 may be formed in the passivation layer 503 and the overcoat layer 504.

Due to the first contact hole CH1, the passivation layer 503 and the overcoat layer 504 may be disposed to expose a portion of the upper surface of the third connection pattern 411.

A light emitting element ED may be disposed on the overcoat layer 504.

Referring to FIG. 9, the anode electrode AE of the light emitting element ED may contact a portion of the upper surface of the third connection pattern 411 through the first contact hole CH1.

As shown in FIG. 9, since the light emitting element ED can emit light even in the area where the first contact hole CH1 is disposed, a reduction in the area of the light emitting area EA2 can be prevented due to a contact between the anode electrode AE and the third connection pattern 411.

Referring to FIG. 10, one subpixel may include a light emitting area EA and a non-light emitting area NEA. Characteristics of the driving voltage line DVL and an electrode 408 overlapping the driving voltage line DVL in FIG. 10 may be the same as those of the driving voltage line DVL and the electrode 408 in FIG. 6.

Referring to FIG. 10, a plurality of connection patterns (e.g., 622, 828, and 441) and the first contact hole CH1 through which the connection patterns (622, 828, and 441) and an anode electrode AE of a corresponding light emitting area EA2 of at least one subpixel contact each other may be disposed in the light emitting area EA2.

Further, at least one signal line may be disposed in the light emitting area EA2.

Referring to FIG. 10, a first portion of the storage capacitor Cst including the first to third storage capacitor electrodes (410, 425, and 440) may be disposed in the light emitting area EA, and the remaining portion of the storage capacitor Cst except for the first portion may be disposed in the non-light emitting area NEA.

As described above, since the components needed to drive the light emitting element ED are disposed to overlap the light emitting area EA, the area of the light emitting area EA can be prevented from being reduced due to the components for driving the light emitting element ED.

As described above, as the first contact hole CH1 through which the anode electrode AE and the third connection pattern 441 contact each other is disposed in the light emitting area, the display device 100 according to the embodiments of the present disclosure can provide advantages of maximizing the area of the light emitting area EA and the area of the transmissive area TA.

Hereinafter, these characteristics will be discussed together with a structure of a display device according to comparative examples.

Figure 11:
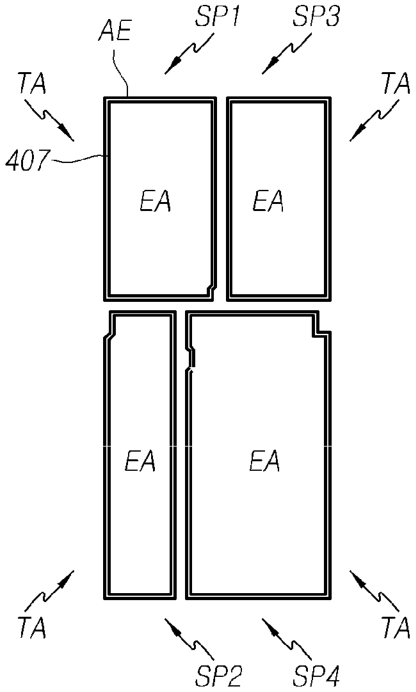
FIG. 11 illustrates an example structure in a plan view in the display device according to embodiments of the present disclosure.

FIG. 11 illustrates an example structure in a plan view in the display device 100 according to aspects of the present disclosure.

Referring to FIG. 11, in one or more embodiments, the display device 100 according to embodiments of the present disclosure may include a plurality of subpixels (SP1, SP2, SP3, and SP4).

Referring to FIG. 11, referring to the structure of the display device 100 according to embodiments of the present disclosure, connection patterns (422, 426, and 441) for repair may be located in a light emitting area.

Among the connection patterns (422, 426, and 441), the third connection pattern 441 may contact the anode electrode AE, and the second connection pattern 426 may be electrically connected to the storage capacitor Cst.

All of an area where the third connection pattern 441 contacts the anode electrode and an area where the second connection pattern 426 contacts the storage capacitor Cst may be disposed in the light emitting areas (EA1, EA2, EA3, and EA4). The light emitting areas (EA1, EA2, EA3, and EA4) may be defined by a bank 407.

Thus, since it is not necessary to extend each of the connection patterns (422, 426, and 441) and the anode electrode AE into the non-light emitting area NEA and a transmissive area TA, a delay in signal delivery that may be caused by the extension of each component can be prevented, and thereby, there can be provided an effect of lowering power consumption.

In addition, since all of an area where the third connection pattern 441 contacts the anode electrode and an area where the second connection pattern 426 contacts the storage capacitor Cst are disposed in the light emitting areas (EA1, EA2, EA3, and EA4), the size of the non-light emitting area NEA can be reduced and the transmittance of the transmissive area TA can be improved.

Referring to FIG. 11, an area where the third connection pattern 441 of the display device 100 according to embodiments of the present disclosure contacts the anode electrode AE may be disposed in respective central portions of the light emitting area (EA1, EA2, EA3, and EA4).

Through this configuration, the thickness of components (in particular, the emission layer) included in the corresponding light emitting element ED can be formed uniformly even in an area where the third connection pattern 441 located in each of the light emitting areas (EA1, EA2, EA3, and EA4) contacts the corresponding anode electrode AE.

This configuration will be discussed in more detail below with reference to FIG. 12.

Figure 12:
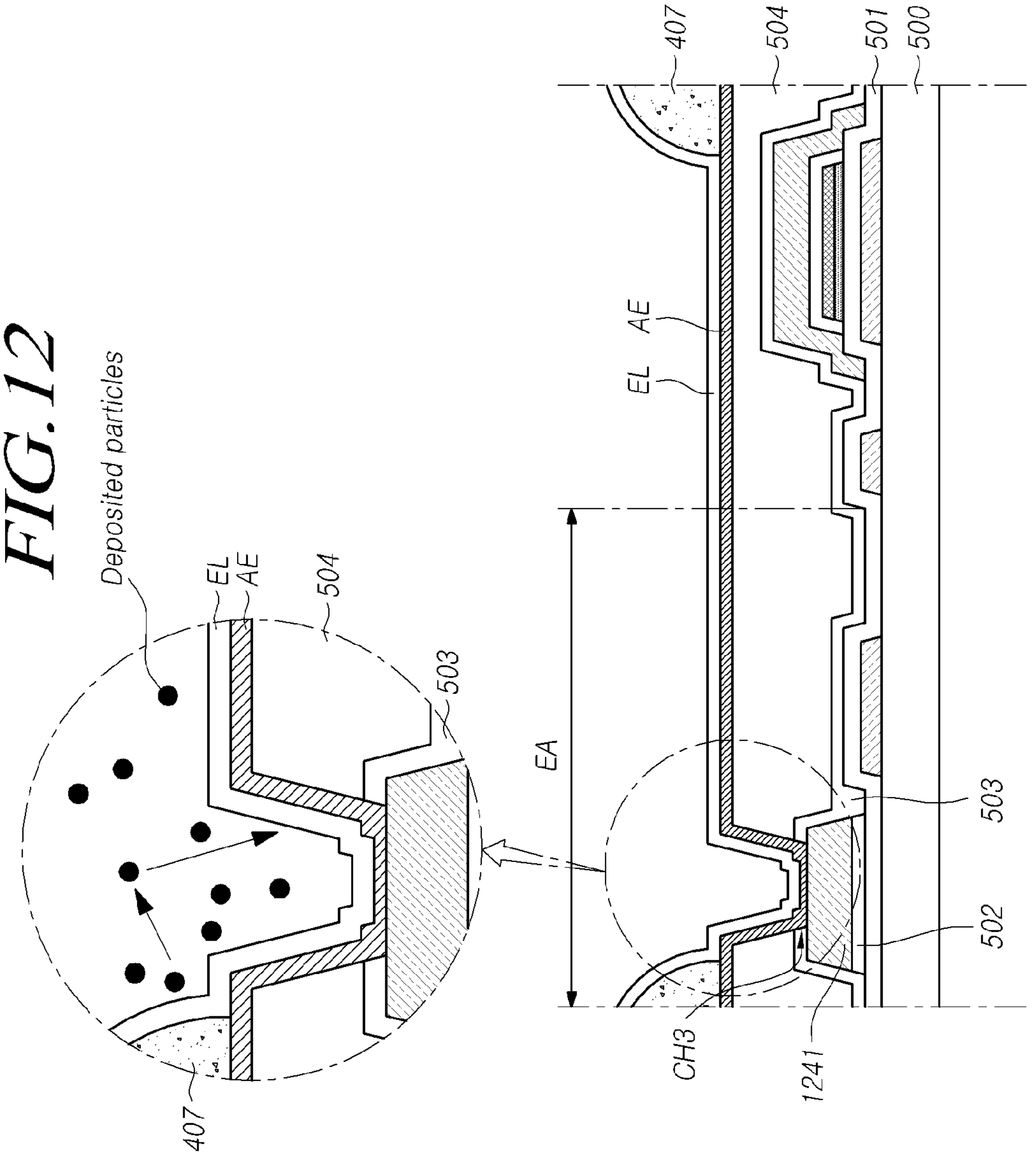
FIG. 12 illustrates an example structure in which an area where a connection pattern and an anode electrode contact is disposed adjacent to a bank in the display device according to aspects of the present disclosure.

FIG. 12 illustrates an example structure in which an area where a connection pattern and an anode electrode contact is disposed adjacent to a bank in the display device 100 according to aspects of the present disclosure.

Referring to FIG. 12, a connection pattern 1241 and an anode electrode AE of a light emitting element may contact each other through a third contact hole CH3 formed in a passivation layer 503 and an overcoat layer 504. A gate insulating layer 502 may be disposed under the connection pattern 1241.

As shown in FIG. 12, the third contact hole CH3 may be disposed in a light emitting area EA, but may be disposed adjacent to a bank 407.

In one or more embodiments, an emission layer EL of the light emitting element may be disposed in the light emitting area EA where the third contact hole CH3 is disposed and disposed on the bank 407.

The emission layer EL may be deposited over the substrate 500 through a deposition method. For example, the emission layer EL may be formed over the substrate 500 through an evaporation deposition method. A buffer layer 502 may be disposed on the substrate 500.

Referring to FIG. 12, since the third contact hole CH3 is disposed adjacent to the bank 407, at least one step may be additionally formed around the third contact hole CH3.

In the process of forming the emission layer EL, a portion of an emission layer (EL) material may be deposited on the side surface of the bank 407, and the remaining portion of the emission layer (EL) material may collide with the side surface of the bank 407.

As a portion of the remaining portion of the emission layer (EL) material that collides with the side surface of the bank 407 is deposited around or in the third contact hole CH3, there is a probability that the uniformity of the thickness of the emission layer EL in the light emitting area EA can be lowered.

As shown in FIGS. 3 to 11, since the first contact hole CH1, which is an area where the third connection pattern 441 and the anode electrode AE contact each other, is located in the central portion of the light emitting area EA, the first contact hole CH1 may be disposed to be spaced apart from the bank 407 by a maximum distance in the light emitting area EA. In other words, the first contact hole CH1 may be disposed to have a maximum separation distance from the bank 407 in the first and second directions.

The embodiments described above will be briefly described as follows.

According to the embodiments described herein, the display panel 110 and the display device 100 may be provided that include the substrate 500 including at least one light emitting area EA and a non-light emitting area NEA, the storage capacitor Cst disposed on the substrate 500 in the light emitting area EA, the first connection pattern 422 disposed over the substrate 500 in the light emitting area EA, the second connection pattern 426 electrically connected to the storage capacitor Cst and disposed on the first connection pattern 422, the third connection pattern 411 disposed on the second connection pattern 426 and electrically connected to the second connection pattern 426, the at least one insulating layer (503, 504) disposed on the third connection pattern 441 and including the first contact hole CH1 exposing a portion of an upper surface of the third connection pattern 441, and the anode electrode AE disposed on the insulating layer (503, 504) and contacting the third connection pattern 441 through the first contact hole CH1, wherein the first contact hole CH1 is located in a central portion of the light emitting area EA.

The third connection pattern 441 may be disposed to overlap a concave portion of the storage capacitor Cst.

According to the embodiments described herein, the display panel 110 and the display device 100 may be provided that are capable of preventing the area of a light emitting area from being reduced and the transmittance of a transmissive area from being lowered by a repair area by employing a structure in which a connection pattern including the repair area is included, and the connection pattern is disposed to overlap the light emitting area.

According to the embodiments described herein, the display panel 110 and the display device 100 may be provided that are capable of simplifying a manufacturing process, minimizing damage caused by etching, and realizing process optimization by employing a structure including a repair pattern, and an active layer included in an electrode included in a light emitting element in a light emitting area.

According to the embodiments described herein, the display panel 110 and the display device 100 may be provided that are capable of being driven with low power by configuring signal lines to extend by a minimum length and thereby enabling minimized signal delay by employing a structure in which a contact hole where a connection pattern and an anode electrode contact each other is located in a concave portion of a storage capacitor.

According to the embodiments described herein, the display panel 110 and the display device 100 may be provided that enable an emission layer of a light emitting element in a light emitting area to be uniformly formed by employing a structure in which an area where a connection pattern and an anode electrode contact each other is located in a central portion of the light emitting area.

The above description has been presented to enable any person skilled in the art to make, use and practice the technical features of the present invention, and has been provided in the context of a particular application and its requirements as examples. Various modifications, additions and substitutions to the described embodiments will be readily apparent to those skilled in the art, and the principles described herein may be applied to other embodiments and applications without departing from the scope of the present invention. The above description and the accompanying drawings provide examples of the technical features of the present invention for illustrative purposes only. That is, the disclosed embodiments are intended to illustrate the scope of the technical features of the present invention.

What is claimed is:

1. A display device comprising:

a substrate comprising at least one light emitting area and a non-light emitting area;

a storage capacitor on the substrate in the at least one light emitting area;

a first connection pattern over the substrate in the at least one light emitting area;

a second connection pattern electrically connected to the storage capacitor, the second connection pattern on the first connection pattern;

a third connection pattern on the second connection pattern, the third connection pattern electrically connected to the second connection pattern;

at least one insulating layer on the third connection pattern, the at least one insulating layer comprising a first contact hole exposing a portion of an upper surface of the third connection pattern, and an anode electrode on the at least one insulating layer and contacting the third connection pattern through the first contact hole, wherein the first contact hole is located in a central portion of the at least one light emitting area.

2. The display device of claim 1, wherein the first contact hole is disposed such that the first contact hole has a maximum separation distance from a bank disposed on a portion of an upper surface of the anode electrode in the at least one light emitting area in a first direction and a second direction intersecting the first direction.

3. The display device of claim 1, wherein the storage capacitor comprises a first storage capacitor electrode, a second storage capacitor electrode on the first storage capacitor electrode, and a third storage capacitor electrode on the second storage capacitor electrode, and wherein at least one concave portion is in the first to third storage capacitor electrodes, and the at least one concave portion and the first contact hole overlap each other.

4. The display device of claim 3, further comprising:

a driving voltage line and a reference voltage line over the substrate, wherein the at least one concave portion is an area in which the first to third storage capacitor electrodes are concavely recessed from the driving voltage line toward the reference voltage line, or an area in which the first to third storage capacitor electrodes are concavely recessed from the driving voltage line toward the reference voltage line.

5. The display device of claim 3, wherein three side surfaces of the first contact hole are surrounded by the first to third storage capacitor electrodes.

6. The display device of claim 3, further comprising:

a first active layer pattern contacting a rear surface of the second storage capacitor, wherein the first active layer pattern is in a same layer as the first connection pattern.

7. The display device of claim 6, wherein the first active layer pattern and the first connection pattern comprise an oxide semiconductor material.

8. The display device of claim 3, wherein the second storage capacitor electrode is in a same layer as the second connection pattern, and the third storage capacitor electrode is in a same layer as the third connection pattern.

9. The display device of claim 1, wherein the first connection pattern comprises at least one first cutting area, which is an area to which laser beams are irradiated while a repair is performed, and at least a portion of the at least one first cutting area overlaps at least a portion of the first contact hole.

10. The display device of claim 9, wherein the at least one first cutting area overlaps the third connection pattern.

11. The display device of claim 1, wherein the first connection pattern comprises at least one second cutting area, which is an area to which laser beams are irradiated while a repair is performed, and the at least one second cutting area is located between first contact hole and the storage capacitor.

12. The display device of claim 11, wherein the at least one second cutting area is non-overlapping with the third connection pattern and the storage capacitor.

13. The display device of claim 1, further comprising:

a plurality of transistors disposed over the substrate, the plurality of transistors comprising active layers, and at least one of the active layers comprises a cutting area.

14. The display device of claim 1, wherein the storage capacitor comprises a first storage capacitor part, a second storage capacitor part, and a third storage capacitor part, and wherein the first and third storage capacitor parts comprise three storage capacitor electrodes, and the second storage capacitor part comprises two storage capacitor electrodes.

15. The display device of claim 14, wherein: the first storage capacitor part comprises a lower storage capacitor electrode, a first intermediate storage capacitor electrode on the lower storage capacitor electrode, and an upper storage capacitor electrode on the first intermediate storage capacitor electrode;

the second storage capacitor part comprises the lower storage capacitor electrode and the upper storage capacitor electrode on the lower storage capacitor electrode; and the third storage capacitor part comprises the lower storage capacitor electrode, a second intermediate storage capacitor electrode on the lower storage capacitor electrode, and the upper storage capacitor electrode on the second intermediate storage capacitor electrode, and wherein the first to third storage capacitor parts share the lower storage capacitor electrode and the upper storage capacitor electrode.

16. The display device of claim 15, wherein the first intermediate storage capacitor electrode and the second intermediate storage capacitor electrode are spaced apart from each other.

17. The display device of claim 14, wherein a first sub-connection pattern, a second sub-connection pattern, and a second connection pattern, which are spaced apart from each other, are on the first connection pattern, and wherein the third connection pattern is electrically connected to the second connection pattern.

18. The display device of claim 17, wherein the first sub-connection pattern is electrically connected to the first storage capacitor part, and the second sub-connection pattern is electrically connected to the second storage capacitor part.

19. The display device of claim 18, wherein a portion of the first connection pattern located between the first sub-connection pattern and the second connection pattern is a third cutting area, and a portion of the first connection pattern located between the second sub-connection pattern and the second connection pattern is a fourth cutting area.

20. The display device of claim 1, wherein the second connection pattern and the third connection pattern comprises a metal material.

21. The display device of claim 1, further comprising:

a transmissive area disposed on at least one side of the at least one light emitting area.

22. A display panel comprising:

a substrate comprising at least one light emitting area and a non-light emitting area;

a storage capacitor on the substrate in the at least one light emitting area, the storage capacitor comprising at least one concave portion;

a first connection pattern over the substrate in the at least one light emitting area;

a second connection pattern electrically connected to the storage capacitor, the second connection pattern on the first connection pattern;

a third connection pattern on the second connection pattern, the third connection pattern electrically connected to the second connection pattern;

at least one insulating layer on the third connection pattern, the at least one insulating layer comprising a first contact hole exposing a portion of an upper surface of the third connection pattern, and an anode electrode on the at least one insulating layer, the anode electrode contacting the third connection pattern through the first contact hole, wherein the third connection pattern overlaps the at least one concave portion of the storage capacitor.

* * * * *